(12) United States Patent
Seong et al.

(10) Patent No.: US 12,205,529 B2
(45) Date of Patent: Jan. 21, 2025

(54) DISPLAY APPARATUS

(71) Applicant: Samsung Display Co., Ltd., Yongin-si (KR)

(72) Inventors: Juyeop Seong, Yongin-si (KR); Hee-Kwon Lee, Yongin-si (KR); Jae-Soo Jang, Yongin-si (KR); Jaewon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/179,937

(22) Filed: Mar. 7, 2023

(65) Prior Publication Data

US 2023/0401999 A1 Dec. 14, 2023

(30) Foreign Application Priority Data

Jun. 13, 2022 (KR) ........................ 10-2022-0071442

(51) Int. Cl.
*G06F 1/16* (2006.01)
*G01B 7/16* (2006.01)
*G09G 3/32* (2016.01)

(52) U.S. Cl.
CPC ................. *G09G 3/32* (2013.01); *G01B 7/18* (2013.01); *G06F 1/1652* (2013.01); *G09G 2320/08* (2013.01); *G09G 2340/04* (2013.01)

(58) Field of Classification Search
CPC .. G09G 3/32; G09G 2320/08; G09G 2340/04; G01B 7/18; G06F 1/1652; G06F 1/1677; G06F 1/1681; G06F 3/04164; G06F 1/1624
See application file for complete search history.

(56) References Cited

U.S. PATENT DOCUMENTS

| 10,001,809 B2 | 6/2018 | Seo et al. |
| 10,887,438 B2 | 1/2021 | Baek et al. |
| 2015/0124403 A1* | 5/2015 | Lee ................... H05K 7/20145 361/692 |
| 2015/0187325 A1* | 7/2015 | Yeo .......................... H04N 5/64 345/156 |

(Continued)

FOREIGN PATENT DOCUMENTS

| KR | 10-1892959 B1 | 8/2018 |
| KR | 10-1971162 B1 | 4/2019 |

*Primary Examiner* — Antonio Xavier
(74) *Attorney, Agent, or Firm* — Lewis Roca Rothgerber Christie LLP

(57) ABSTRACT

Provided is a display apparatus including a display layer including scan lines, data lines, and pixels, and defined by a first area exposed to an outside in both a closed state and an open state, and a second area, which extends from the first area in a first direction, is exposed to an outside in the open state, and in which at least a portion thereof is opposite to the first area in the closed state, a scan-driving circuit connected to the scan lines, deformation sensors arranged in the first direction and having resistance values corresponding to respective shapes of the display layer, deformation sensor drivers arranged in the first direction, respectively connected to the deformation sensors, and configured to drive the deformation sensors along the first direction, and a driving circuit configured to measure the resistance values of the deformation sensors.

17 Claims, 15 Drawing Sheets

(56) References Cited

U.S. PATENT DOCUMENTS

| | | | |
|---|---|---|---|
| 2015/0220119 A1* | 8/2015 | Seo | G09G 5/37 |
| | | | 345/173 |
| 2017/0316738 A1* | 11/2017 | Sohn | G09G 3/3275 |
| 2018/0174505 A1* | 6/2018 | Mandlik | G09G 3/035 |
| 2020/0241664 A1* | 7/2020 | Lee | G06F 3/03547 |
| 2021/0056871 A1* | 2/2021 | Lu | G09F 9/301 |
| 2022/0253103 A1* | 8/2022 | Choi | G09F 9/301 |
| 2023/0221767 A1* | 7/2023 | Vakhshouri | G06F 1/1616 |
| | | | 345/173 |
| 2023/0418387 A1* | 12/2023 | Kim | G06F 3/017 |

\* cited by examiner

FIG. 4
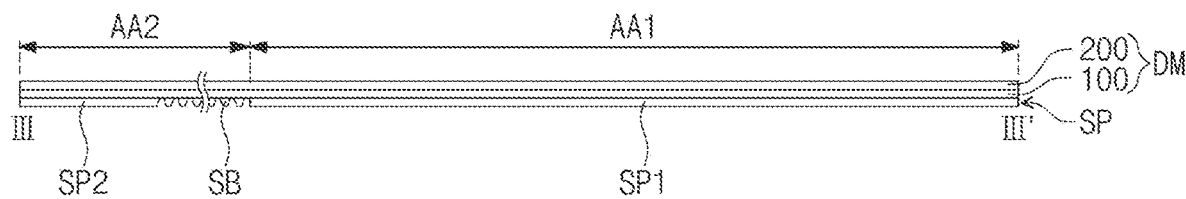
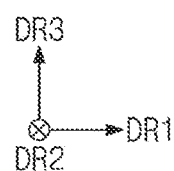
FIG. 5
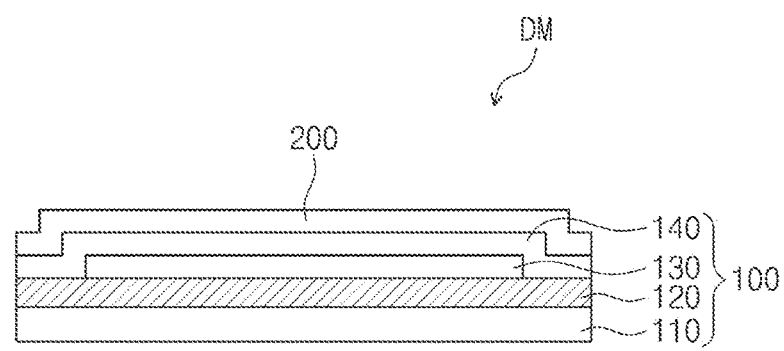
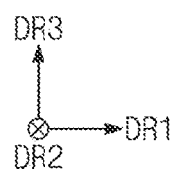

DISPLAY APPARATUS

CROSS-REFERENCE TO RELATED APPLICATIONS

This application claims priority to, and the benefit of, Korean Patent Application No. 10-2022-0071442, filed on Jun. 13, 2022, the entire contents of which are hereby incorporated by reference.

BACKGROUND

1. Field

The present disclosure herein relates to a slidable display apparatus.

DESCRIPTION OF THE RELATED ART

A display apparatus of a smartphone, a digital camera, a notebook computer, a navigator, a smart television, or the like provides an image to a user through a display screen. The display apparatus may include a display layer generating the image.

Recently, various types of display apparatuses are being developed with technological developments. For example, foldable or rollable flexible display apparatuses are being developed. Flexible display apparatuses, the shapes of which being able to be transformed in various ways, are suitably portable, and may improve user convenience.

An expandable flexible display apparatus among the flexible display apparatuses may accommodate at least a portion thereof in the case, or may be drawn out from the case as needed. Accordingly, a user may expand the display screen as needed.

SUMMARY

The present disclosure provides a display apparatus with improved reliability.

One or more embodiments of the present disclosure provide a display apparatus including a display layer including scan lines, data lines, and pixels, and defined by a first area exposed to an outside in both a closed state and an open state, and a second area, which extends from the first area in a first direction, is exposed to an outside in the open state, and in which at least a portion thereof is opposite to the first area in the closed state, a scan-driving circuit connected to the scan lines, deformation sensors arranged in the first direction and having resistance values corresponding to respective shapes of the display layer, deformation sensor drivers arranged in the first direction, respectively connected to the deformation sensors, and configured to drive the deformation sensors along the first direction, and a driving circuit configured to measure the resistance values of the deformation sensors.

The deformation sensors may be adjacent to a display area of the display layer.

When viewed in a plan view, a display area of the display layer, the scan-driving circuit, and the deformation sensors may be arranged in a second direction crossing the first direction.

Each of the deformation sensors may include a strain gauge having a spirally wound shape.

The deformation sensors may be in the second area.

The display apparatus may further include a motor configured to drive the display layer to the closed state or to the open state, and configured to be controlled based on the resistance values measured from the deformation sensors.

The display apparatus may further include a thermometer electrically connected to the driving circuit, and configured to measure temperature information about the display layer, wherein the driving circuit is configured to drive the motor based on the temperature information.

Each of the resistance values may be greater than a prescribed value, the motor is configured to reduce a sliding speed of the display layer.

The display apparatus may further include a sensor layer on the display layer, and including sensing electrodes, and a case including a position-sensing sensor, configured to accommodate the display layer, and configured to switch between the closed state and the open state through a sliding operation, wherein a sliding position of the display layer is configured to be determined based on the position-sensing sensor and the sensing electrodes.

The sensing electrodes and the position-sensing sensor may overlap each other in the closed state.

The deformation sensors and the deformation sensor drivers may be on a same layer as the sensing electrodes.

A first portion exposed to the outside, and a second portion extending from the first portion and not exposed to the outside, may be defined in the second area, and wherein the driving circuit is configured to determine a boundary between the first portion and the second portion based on the resistance values, and is configured to determine a sliding position of the display layer based on the boundary.

The driving circuit may be configured to display an image on the first portion and not on the second portion.

The pixels may include transistors and light-emitting elements, wherein the deformation sensors and the deformation sensor drivers are on a same layer as at least one of the transistors.

One or more embodiments of the present disclosure provide a display apparatus including a display layer defined by a first area and a second area arranged along a first direction, deformation sensors arranged in the first direction and having respective resistance values corresponding to respective shapes of the display layer, and a driving circuit configured to measure the resistance values of the deformation sensors along the first direction.

The deformation sensors may be adjacent to the display layer.

The display apparatus may further include deformation sensor drivers arranged along the first direction, respectively connected with the deformation sensors, and configured to drive the deformation sensors along the first direction.

The display apparatus may further include a motor configured to drive a sliding state of the second area, and configured to be controlled based on the respective resistance values measured from the deformation sensors.

The display apparatus may further include a sensor layer on the display layer, and including sensing electrodes, and a case configured to accommodate the second area through a sliding operation of the display layer, and including a position-sensing sensor, wherein a sliding position of the display layer is configured to be determined based on the position-sensing sensor and the sensing electrodes.

The driving circuit may be configured to determine a boundary between a first portion and a second portion based on the resistance values, is configured to determine a sliding position of the display layer based on the boundary, and is configured to display an image on the first portion and not on the second portion.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings:

FIG. 4 is a cross-sectional view of the display module and the support member cut along the line III-III' of FIG. 3 according to one or more embodiments of the present disclosure;

FIG. 5 is a cross-sectional view of a display module according to one or more embodiments of the present disclosure;

DETAILED DESCRIPTION

Figure 1:
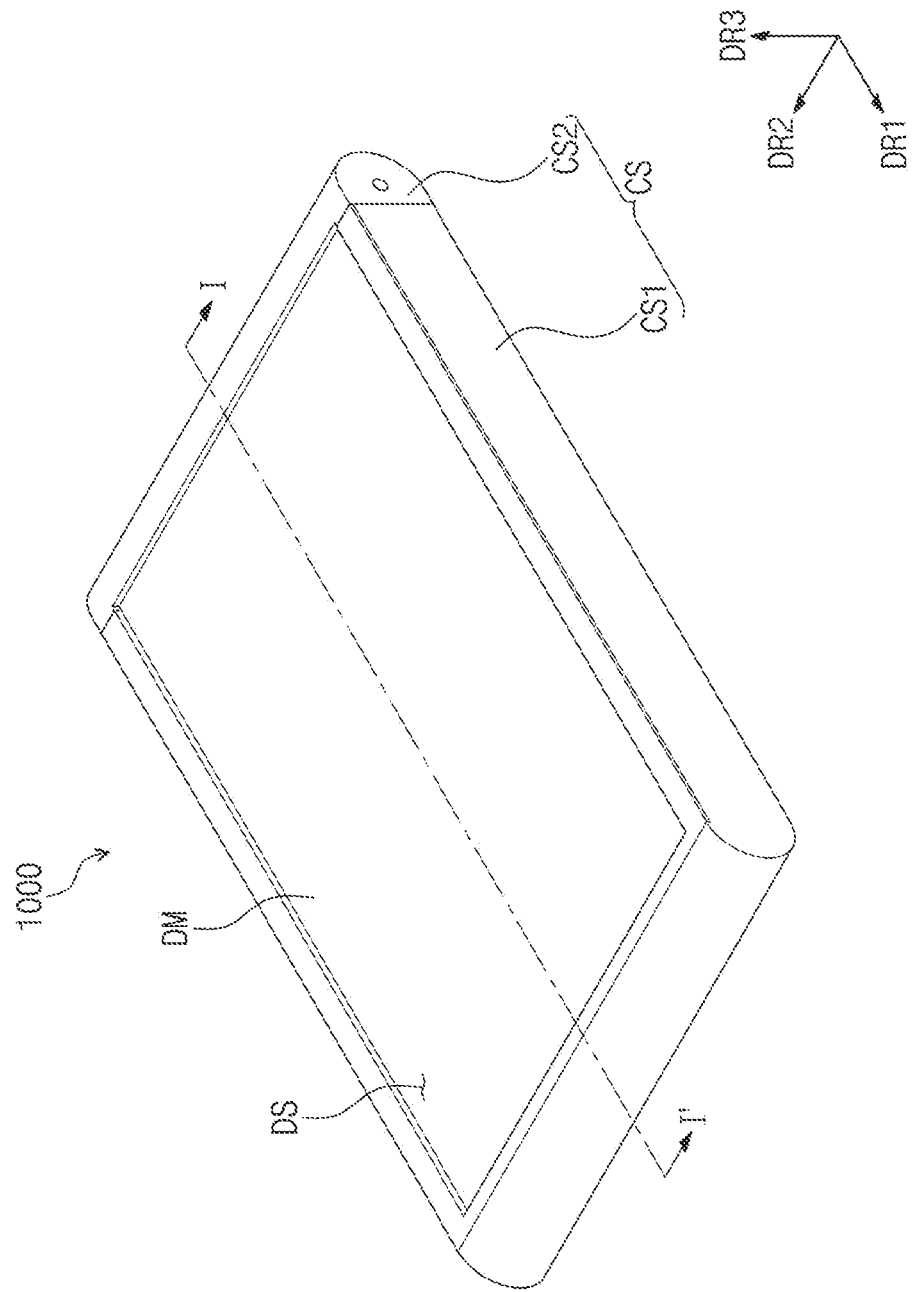
FIG. 1 is a perspective view of a display apparatus according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "at least one among," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
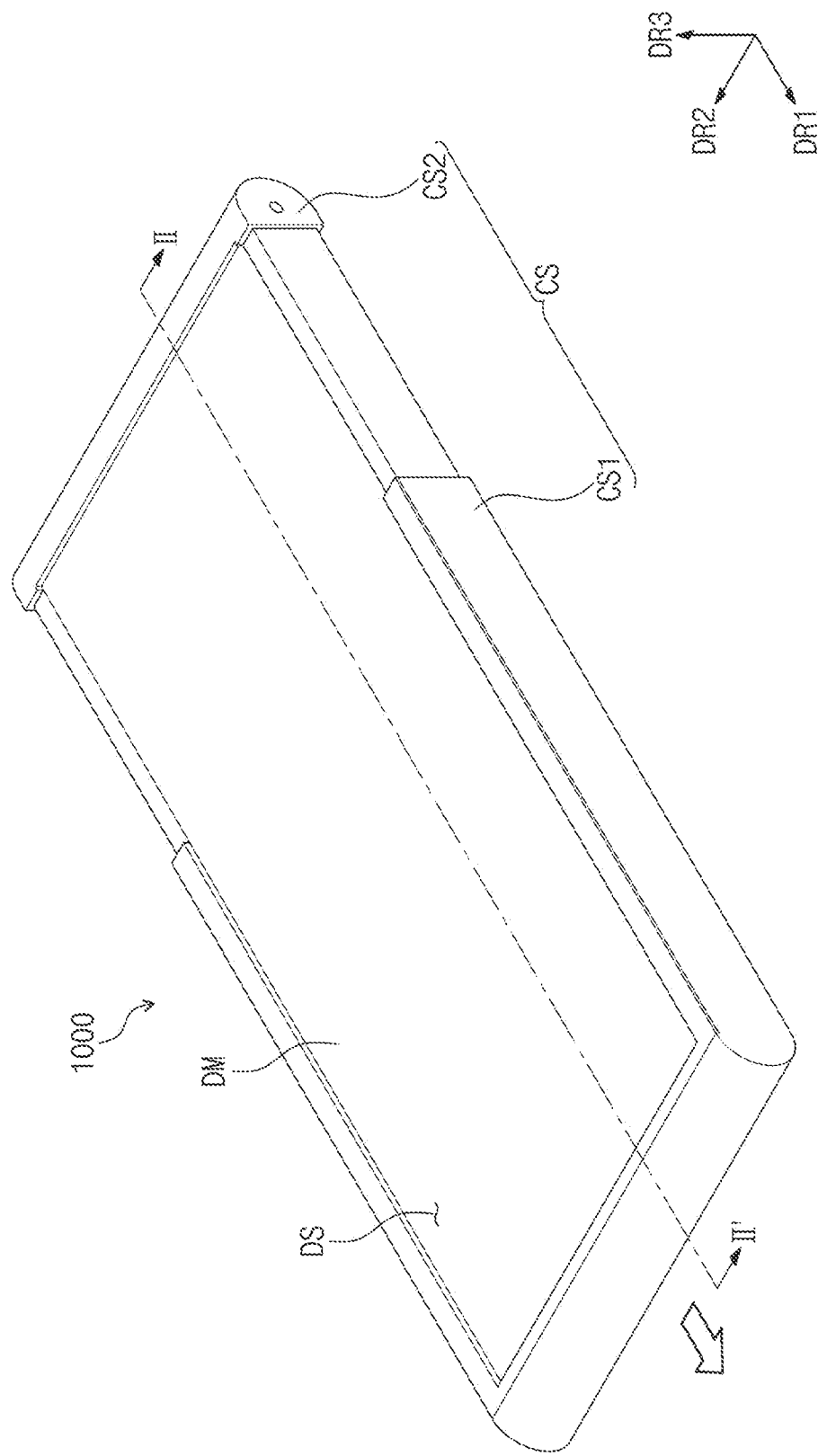
FIG. 2 is a perspective view illustrating an open state of the display apparatus of FIG. 1 according to one or more embodiments of the present disclosure.

FIG. 1 is a perspective view of a display apparatus according to one or more embodiments of the present disclosure, and FIG. 2 is a perspective view of an open state of the display apparatus according to one or more embodiments of the present disclosure.

Referring to FIGS. 1 and 2, the display apparatus 1000 may include a display module DM, and a case CS in which the display module DM is accommodated. The display module DM may be exposed to the outside through an opening defined on the top of the case CS.

The case CS may include a first case CS1 and a second case CS2. The first case CS1 and the second case CS2 may be coupled to each other to accommodate the display module DM. The first case CS1 may be coupled to the second case CS2 in such a way that the first case CS1 is movable in a first direction DR1. FIG. 1 shows a closed state of the display apparatus 1000 before the first case CS1 moves.

Hereinafter, a direction crossing the first direction DR1 is defined as a second direction DR2. A direction substantially perpendicularly crossing a plane defined by the first and second directions DR1 and DR2 is defined as a third direction DR3. In the present specification, it may be understood that when one or more components are "viewed in a plan view," the components may be viewed in a direction opposite to the third direction DR3.

In the display module DM, a display surface DS may be defined to be exposed through the opening of the case CS. The area of the display surface DS may be adjusted by movement of the first case CS1 with respect to the second case CS2. For example, the display module DM may be a flexible display module, and may be supported by a support member located under the display module DM. The support member may be connected to the first case CS1, and when the first case CS1 moves in the first direction DR1, the support member may also move in the first direction DR1. FIG. 2 illustrates an open state in which the first case CS1 of the display apparatus 1000 moves in the first direction DR1.

In one or more other embodiments, except for the display surface DS of the display module DM exposed through the opening, a portion of the display module DM that is not exposed to the outside may be located in the first case CS1. The size of the display surface DS may increase in the first direction DR1 by the movement of the first case CS1. In addition, as the first case CS1 moves, the display module DM located on the support member moves together with the support member in the first direction DR1, which results in expansion of the display surface DS of the display module DM. Accordingly, the user may view the image through the expanded screen.

Hereinafter, as shown in FIG. 1, a state of the display apparatus 1000 in which the display surface DS of the display module DM is set as a default size may be defined as a closed state. As shown in FIG. 2, a state of the display apparatus 1000 in which the display surface DS of the display module DM expands may be defined as an open state. In one or more embodiments, the closed state of the display apparatus 1000 may correspond to the closed state of the case CS, and the open state of the display apparatus 1000 may correspond to the open state of the case CS. When in the closed state, the case CS1 moves in the first direction DR1 to expand the display DS of the display module DM and the case CS may be changed to the open state. In other words, the case CS may change the display apparatus 1000 from the closed state to the open state, and vice versa.

Figure 3:
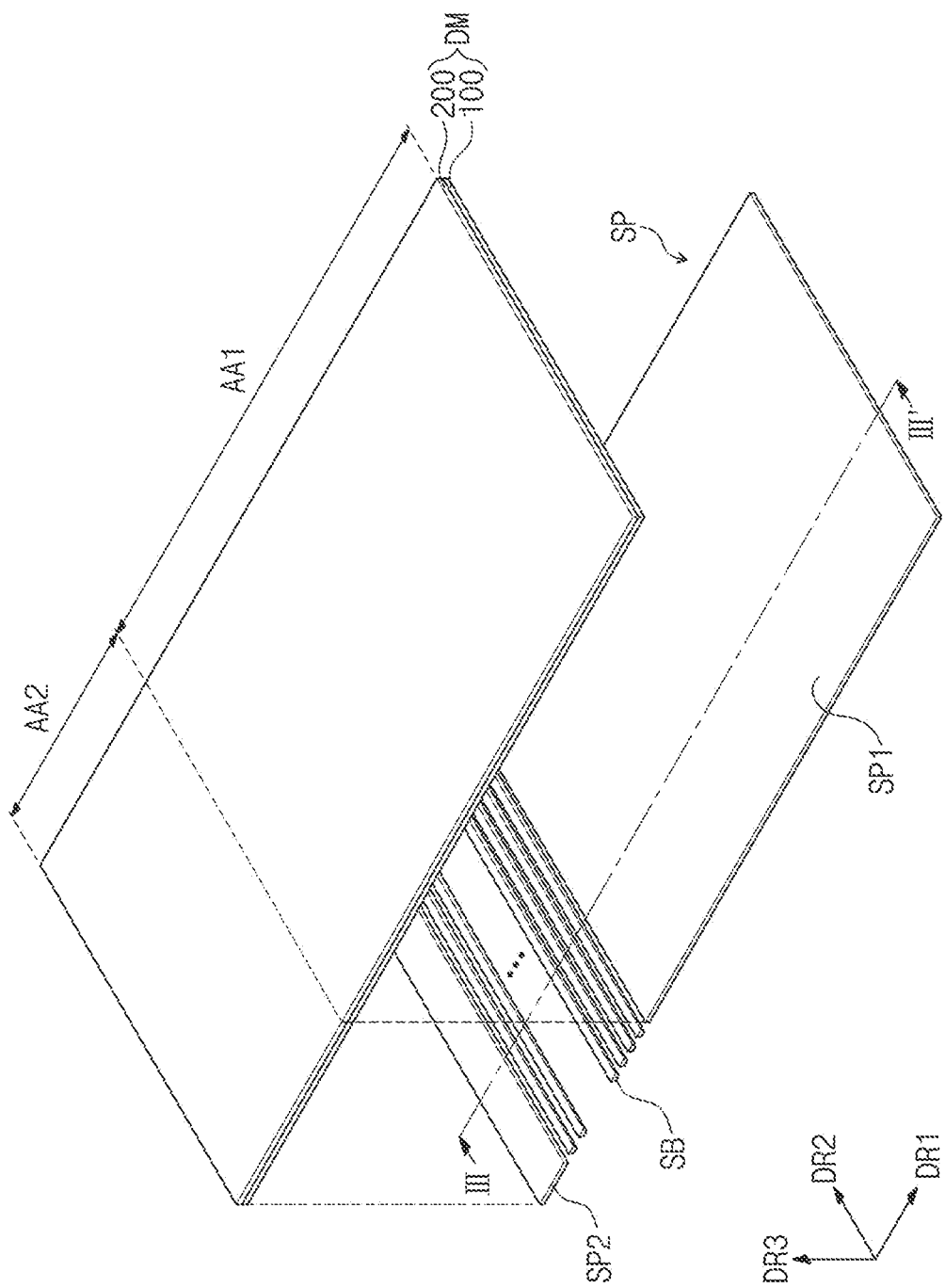
FIG. 3 is a perspective view illustrating a display module and a support member according to one or more embodiments of the present disclosure.

FIG. 3 a perspective view showing a display module and a support member according to one or more embodiments of the present disclosure, and FIG. 4 is a cross-sectional view of the display module and the support member cut along the line III-III' of FIG. 3 according to one or more embodiments of the present disclosure.

Referring to FIGS. 3 and 4, the display module DM may include a display layer 100 and a sensor layer 200.

The display layer 100 may be a component configured to substantially generate an image. The display layer 100 according to one or more embodiments of the present disclosure may be an emissive display layer, but is not particularly limited thereto. For example, the display layer 100 may be an organic light-emitting-display layer, a quantum dot light-emitting-display layer, a micro-LED-display layer, or a nano-LED-display layer. A light-emitting layer of the organic light-emitting-display layer may include an organic light-emitting material. A light-emitting layer of the quantum dot light-emitting display panel may include quantum dots, quantum rods, or the like. A light emission layer of the micro-LED-display layer may include micro-LEDs. A light emission layer of the nano-LED-display layer may include nano-LEDs.

The sensor layer 200 may be located on the display layer 100. The sensor layer 200 may sense an external input.

The display surface DS of the display module DM may include a first area AA1 and a second area AA2.

In a default mode, the first area AA1 may be provided in a size corresponding to the display surface DS in FIG. 1 to determine the size of the screen in the closed state. The first area AA1 may be exposed to the outside in the closed state and in the open state. In other words, the display surface DS may be defined as the first area AA1 in the closed state while the second area AA2 is not exposed to the outside. In one or more other embodiments of the present disclosure, however, a portion of the first area AA1 and the second area AA2 may be exposed to the outside in the closed state.

The second area AA2 may expand or extend in the first direction DR1 from the first area AA1. The second AA2 may be adjacent to the first area AA1. When the display apparatus 1000 is in the open state, at least a portion of not only the first area AA1 but also the second area AA2 may be exposed to the outside. The screen size of the display apparatus 1000 may increase by at least the area of the exposed portion of the second area AA2.

In the open state, another portion, other than at least the exposed portion of the second AA2, might not be exposed to the outside. The other portion might not be exposed to the outside in the closed and open states.

The support member SP may be located under the display module DM to support the display module DM. The support member SP may be located at the rear surface opposite to the display surface DS of the display module DM.

The support member SP may be composed of a material with higher rigidity than the display module DM. In one or more embodiments, the support member SP may be a metal plate, such as aluminum. The support member SP may include a first support part SP1, a plurality of support bars SB, and a second support part SP2. The first support part SP1 may support the first area AA1 of the display module DM, and the plurality of support bars SB and the second support part SP2 may support the second area AA2 of the display module DM.

The plurality of support bars SB may be located between the first support part SP1 and the second support part SP2. Each of the plurality of support bars SB may extend in the second direction DR2. The plurality of support bars SB may be arranged to be spaced apart from each other in the first direction DR1. In one or more embodiments of the present disclosure, when viewed in the second direction DR2, each of the plurality of support bars SB may have a reversed trapezoidal shape on the basis of the display surface DS of the display module DM. Due to the shapes, the plurality of support bars SB may be suitably bent.

In FIGS. 3 and 4, the plurality of support bars SB spaced apart from each other in the first direction DR1 are shown as an example, but the structure of the plurality of support bars SB is not limited thereto. For example, the plurality of support bars SB may have a joint structure in which the support bars SB are combined to rotate around each other.

The first support part SP1 may have a plane defined by the first and second directions DR1 and DR2. The first support part SP1 may be provided in a size corresponding to the first area AA1 of the display module DM. The first support part SP1 may be located at the rear surface opposite to the display surface DS of the display module DM to support the first area AA1 of the display module DM.

A second support part SP2 may overlap the second area AA2. At least a portion of the second support part SP2 may face, or may be opposite to, the first support part SP1 in the closed state. Description thereabout will be provided below. The second support part SP2 may include a metal plate. The plurality of support bars SB and the second support part SP2 may be located at the rear surface of the display module DM to support the second area AA2.

In one or more other embodiments, an adhesive may be located between the display module DM and the support member SP to attach the support member SP to the rear surface of the display module DM. For example, the adhesive may include a pressure sensitive adhesive, or may include various other adhesives without being limited thereto.

FIG. 5 is a cross-sectional view of a display module according to one or more embodiments of the present disclosure.

Referring to FIG. 5, the display module DM may include a display layer 100 and a sensor layer 200.

The display layer 100 may include a base layer 110, a circuit layer 120, a light-emitting-element layer 130, and an encapsulation layer 140.

The base layer 110 may be a member for providing a base surface with the circuit layer 120 located thereon. The base layer 110 may be a glass substrate, a metal substrate, or a polymer substrate. However, the present disclosure is not limited thereto, and the base layer 110 may be an inorganic layer, an organic layer, or a composite material layer.

The base layer 110 may have a multilayer structure. For example, the base layer 110 may include a first composite resin layer, a silicon oxide (SiOx) layer located on the composite resin layer, an amorphous silicon (a-Si) layer located on the silicon oxide layer, and a second composite resin layer located on the amorphous silicon layer. The silicon oxide layer and the amorphous silicon layer may be referred to as a base barrier layer.

Each of the first and second composite resin layers may include polyimide-based resin. In addition, each of the first and second composite resin layers may include at least one among an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Further, in the present discourse, "~~"-based resin means including a functional group "~~".

The circuit layer 120 may be located on the base layer 110. The circuit layer 120 may include an insulation layer, a semiconductor pattern, a conductive pattern, a signal line and the like. The insulation layer, the semiconductor layer, and the conductive layer are defined on the base layer 110 in a manner of coating, deposition, or the like, and then the insulation layer, the semiconductor layer, and the conductive layer may be selectively patterned through a plurality of times of a photolithography process. Then, the semiconductor pattern, the conductive pattern, and the signal line included in the circuit layer 120 may be provided.

The light-emitting-element layer 130 may be located on the circuit layer 120. The light-emitting-element layer 130 may include a light-emitting element. For example, the light-emitting-element layer 130 may include an organic light-emitting material, a quantum dot, a quantum rod, a micro-LED, or a nano-LED.

The encapsulation layer 140 may be located on the light-emitting-element layer 130. The encapsulation layer 140 may protect the light-emitting-element layer 130 from a foreign matter, such as moisture, oxygen, and dust particles. The sensor layer 200 may be located on the display layer 100. The sensor layer 200 may sense an external input applied from the outside.

The sensor layer 200 may be located on the display layer 100 through continuous processes. In this case, the sensor layer 200 may be represented as being directly located on the display layer 100. Being "directly located on" may mean that a third element is not located between the sensor layer 200 and the display layer 100. In other words, a separate adhesive member might not be located between the sensor layer 200 and the display layer 100. Alternatively, the sensor layer 200 may be bonded to the display layer 100 through an adhesive member. The adhesive member may include a typical adhesive or a pressure sensitive adhesive.

Figure 6:
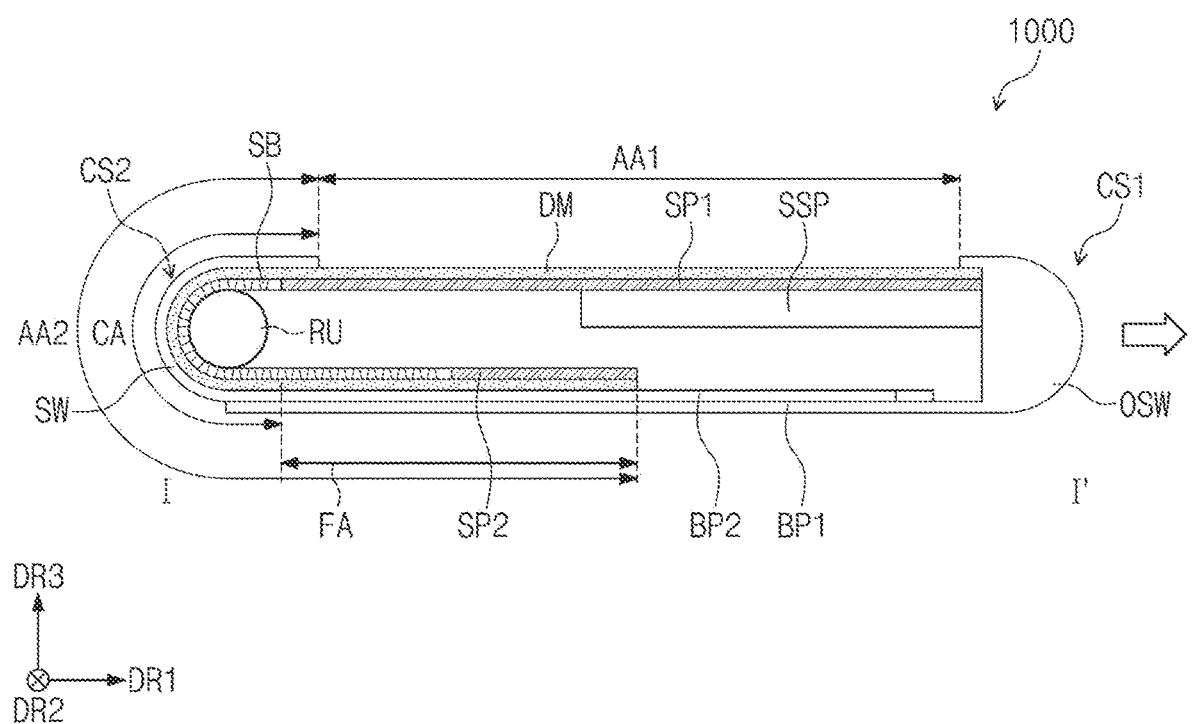
FIG. 6 is a cross-sectional view of the display apparatus cut along the line I-I' of FIG. 1 according to one or more embodiments of the present disclosure.
Figure 7:
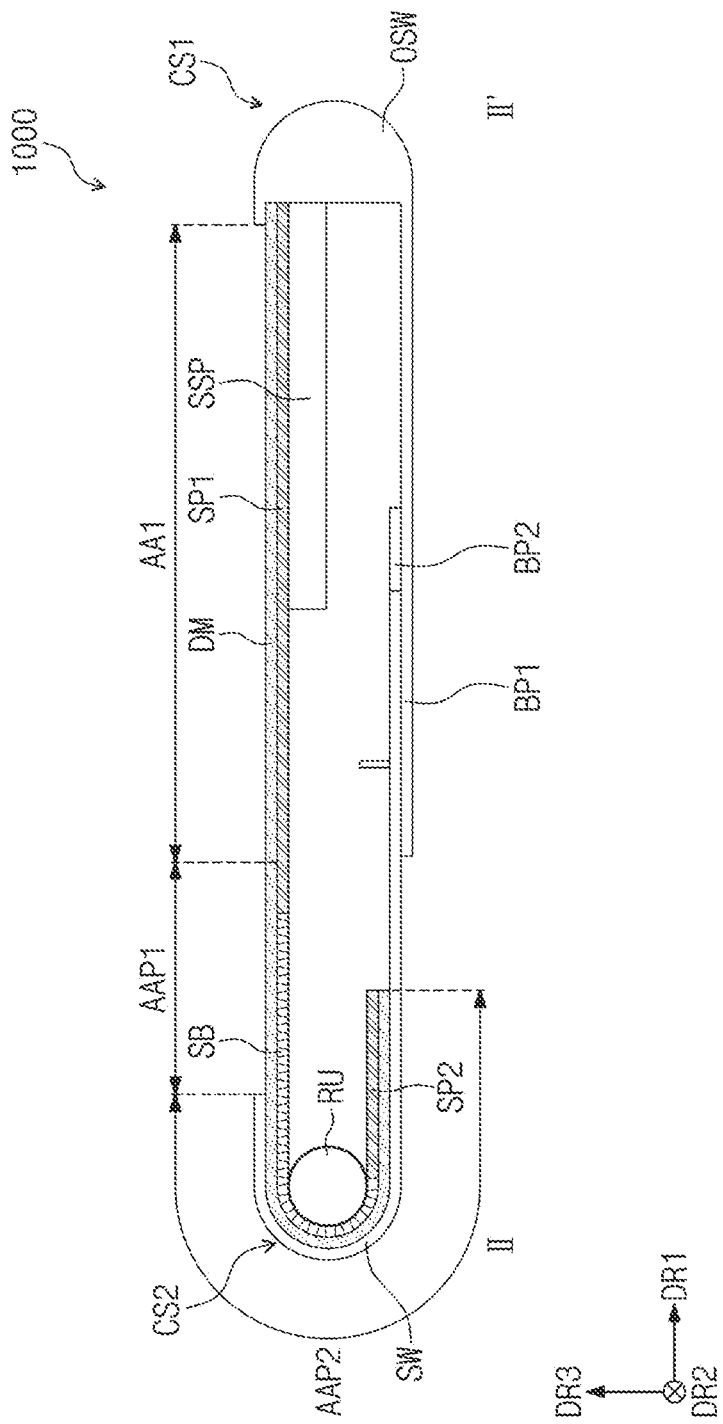
FIG. 7 is a cross-sectional view of the display apparatus cut along the line II-II' of FIG. 2 according to one or more embodiments of the present disclosure.

FIG. 6 is a cross-sectional view of the display apparatus cut along the line I-I' of FIG. 1 according to one or more embodiments of the present disclosure, and FIG. 7 is a cross-sectional view of the display apparatus cut along the line II-II' of FIG. 2 according to one or more embodiments of the present disclosure.

Referring to FIGS. 6 and 7, the display apparatus 1000 may include a display module DM, a support member SP, and a case CS.

The display apparatus 1000 may have a closed state and an open state. The closed state and open state of the display apparatus 1000 may be determined according to a sliding operation of the case CS. The closed state of the display apparatus 10000 in one or more embodiments of the present disclosure may correspond to a case where the first case CS1 and the second case CS2 move to the end in a direction as they get closer to each other. The open state of the display apparatus 1000 may correspond to a case where the first case CS1 and the second case CS2 move to the end in a direction as they get away from each other.

The closed state and open state of the display apparatus 1000 may be determined on the basis of an area exposed to the outside. A first area AA1 and a second area AA2 may be defined in the display module DM. The first area AA1 may be exposed to the outside in the closed state. The second area AA2 may expand or extend from the first area AA1. The second area AA2 might not be exposed to the outside in the closed state.

The second area AA2 may include a curvature area CA having a curvature, and a flat area FA expanding from the curvature area CA and facing, or opposite to, the first area AA1. In FIG. 7, at least a portion of the second area AA2 may be exposed to the outside in the open state. At least the portion of the second area AA2 may be defined as a first portion AAP1. Here, a portion of the second area AA2, which is not exposed to the outside (e.g., in a closed state), may be defined as a second portion AAP2. At least a portion of the second area AA2, which is exposed to the outside in the open state, may be located in the curvature area CA in the closed state.

The support member SP may support the display module DM. The support member SP may include a first support part SP1 and a second support part SP2. The support member SP may include a metal plate. The first support part SP1 may support the first area AA1 of the display module DM, and the second support part SP2 may support the flat area FA in the second area AA2 of the display module DM. The second support part SP2, which supports the flat area FA, may include a metal plate. The support member SP may include the plurality of support bars SB. The plurality of support bars SB may support the curvature area CA in the second area AA2.

In one or more embodiments of the present disclosure, the support member SP may further include a sub-support plate SSP. The sub-support plate SSP may be located at the rear surface of the first support part SP1 to support the first support part SP1. In one or more other embodiments, an accommodation space, which may accommodate various kinds of components (such as a battery or a driving element), may be provided between the sub-support plate SSP and the first bottom part BP1.

The case CS may accommodate the display module DM and the support member SP. The case CS may include a first case CS1 and a second case CS2. The second case CS2 may be coupled to the first case CS1 so as to move closer to, or further away from, the first case CS1 in the first direction DR1.

The display module DM and the support member SP may be fixed and coupled to the first case CS1. The case CS may switch between the closed state and the open state of the display apparatus 1000 by means of a sliding operation.

The first case CS1 may include a side wall OSW and a first bottom part BP1. The second case CS2 may include a side wall SW and a second bottom part BP2. The display module DM and the support member SP may be fixed to the side wall OSW of the first case CS1.

The display apparatus 1000 may include a rotation unit RU. The rotation unit RU may be located in, and coupled to, the second case CS2. For example, the rotation unit RU may be coupled to the side wall SW of the second case CS2. The rotation unit RU may rotate according to the sliding operation of the case CS, and may expand or contract the display surface DS (see FIG. 1).

Figure 8:
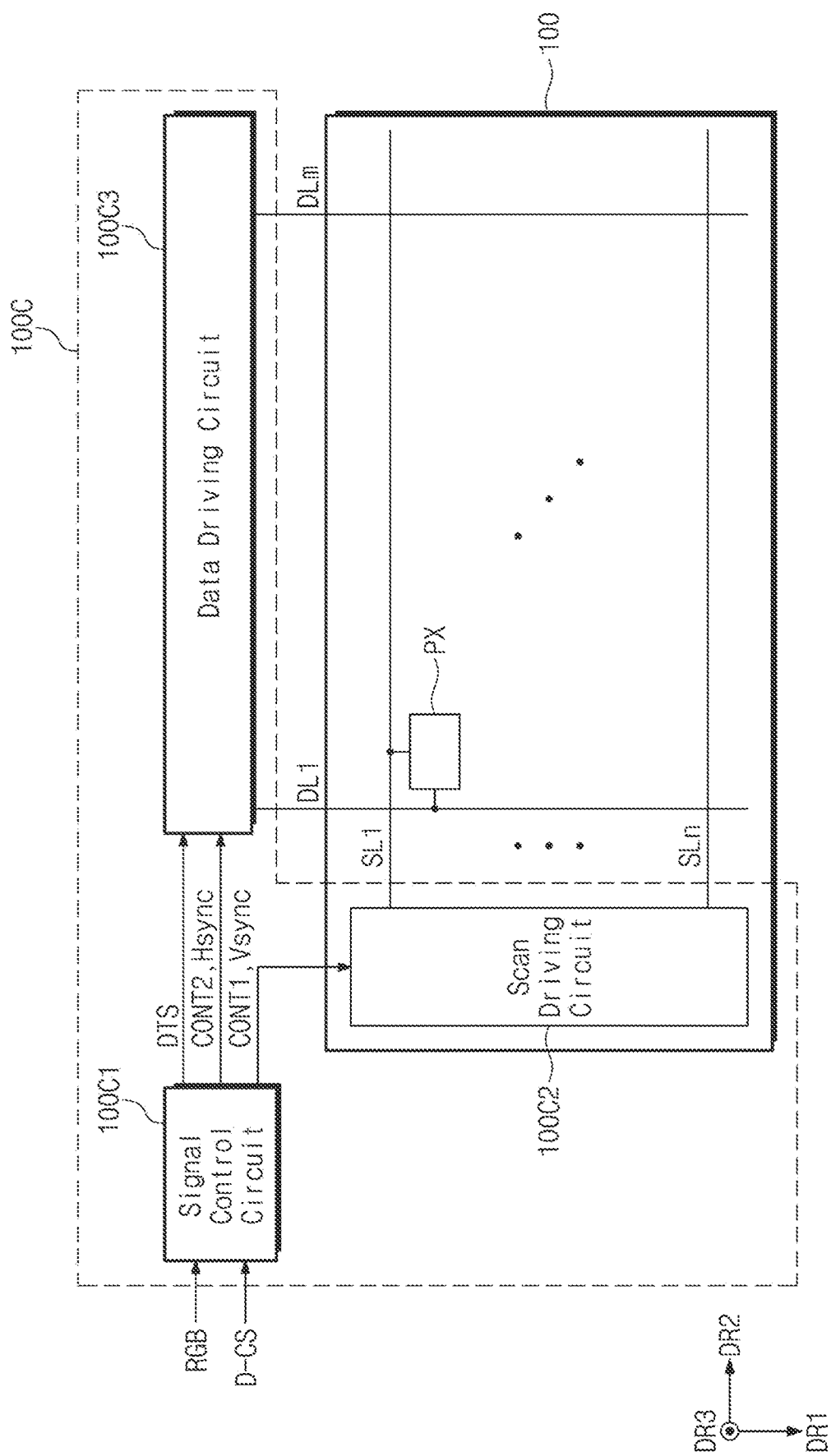
FIG. 8 is a block diagram of a display layer and a display controller according to one or more embodiments of the present disclosure.

FIG. 8 is a block diagram of a display layer and a display controller (e.g., display control unit) according to one or more embodiments of the present disclosure.

Referring to FIG. 8, the display layer 100 may include a plurality of scan lines SL1 to SLn, a plurality of data lines DL1 to DLM, and a plurality of pixels PX. The plurality of pixels PX may be respectively connected to corresponding data lines among the plurality of data lines DL1 to DLm, and to corresponding scan lines among the plurality of scan lines SL1 to SLm. In one or more embodiments of the present disclosure, the display layer 100 may further include light emission control lines, and the display controller 100C may also further include a light-emission-driving circuit configured to provide control signals to the light emission control lines, Description thereabout will be provided below. The configuration of the display layer 100 is not particularly limited.

The display controller 100C may include a signal control circuit 100C1, a scan-driving circuit 100C2, and a data-driving circuit 100C3.

The signal control circuit 100C1 may receive input data RGB and a control signal D-CS from an external controller (e.g., external control unit). The external controller may include a graphic processor (e.g., a graphic processing unit). The control signal D-CS may include various signals. For example, the control signal D-CS may include an input vertical synchronization signal, an input horizontal synchronization signal, a main clock, a data enable signal and the like.

The signal control circuit 100C1 may generate a first control signal CONT1 and a vertical synchronization signal Vsync on the basis of (e.g., based on) the control signal D-CS, and may output the first control signal CONT1 and the vertical synchronization signal Vsync to the scan-driving circuit 100C2. The vertical synchronization signal Vsync may be included in the first control signal CONT1.

The signal control circuit 100C1 may generate a second control signal CONT2 and a horizontal synchronization signal Hsync on the basis of the control signal D-CS, and may output the second control signal CONT2 and the horizontal synchronization signal Hsync to the data-driving circuit 100C3. The horizontal synchronization signal Hsync may be included in the second control signal CONT2.

In addition, the signal control circuit 100C1 may output a data signal DTS to the data-driving circuit 100C3, the data signal being obtained by processing the image data RGB in correspondence to an operation condition of the display layer 100. The first control signal CONT1 and the second control signal CONT2 are respective signals suitable for operating the scan-driving circuit 100C2 and the data-driving circuit 100C3, and are not particularly limited.

The scan-driving circuit 100C2 may drive the plurality of scan lines SL1 to SLn in response to the first control signal CONT1 and the vertical synchronization signal Vsync. In one or more embodiments of the present disclosure, the scan-driving circuit 100C2 may be provided in the same process as the circuit layer 120 (see FIG. within the display layer 100, but is not limited thereto. For example, the scan-driving circuit 100C2 may be implemented in an integrated circuit to be directly mounted in a prescribed area of the display layer 100, or may be mounted on a separate printed circuit board in a chip on film (COF) manner to be electrically connected to the display layer 100.

The data-driving circuit 100C3 may output grayscale voltages for driving the plurality of data lines DL1 to DLm in response to the second control signal CONT2, the horizontal synchronization signal Hsync, and the data signal DTS from the signal control circuit 100C1. The data-driving circuit 100C3 may be implemented in an integrated circuit to be directly mounted in a prescribed area of the display layer 100, or may be mounted on a separate printed circuit board in the COF manner to be electrically connected to the display layer 100, but is not particularly limited. For example, the data-driving circuit 100C3 may be provided in the same process as the circuit layer 120 (see FIG. 2A) within the display layer 100.

Figure 9:
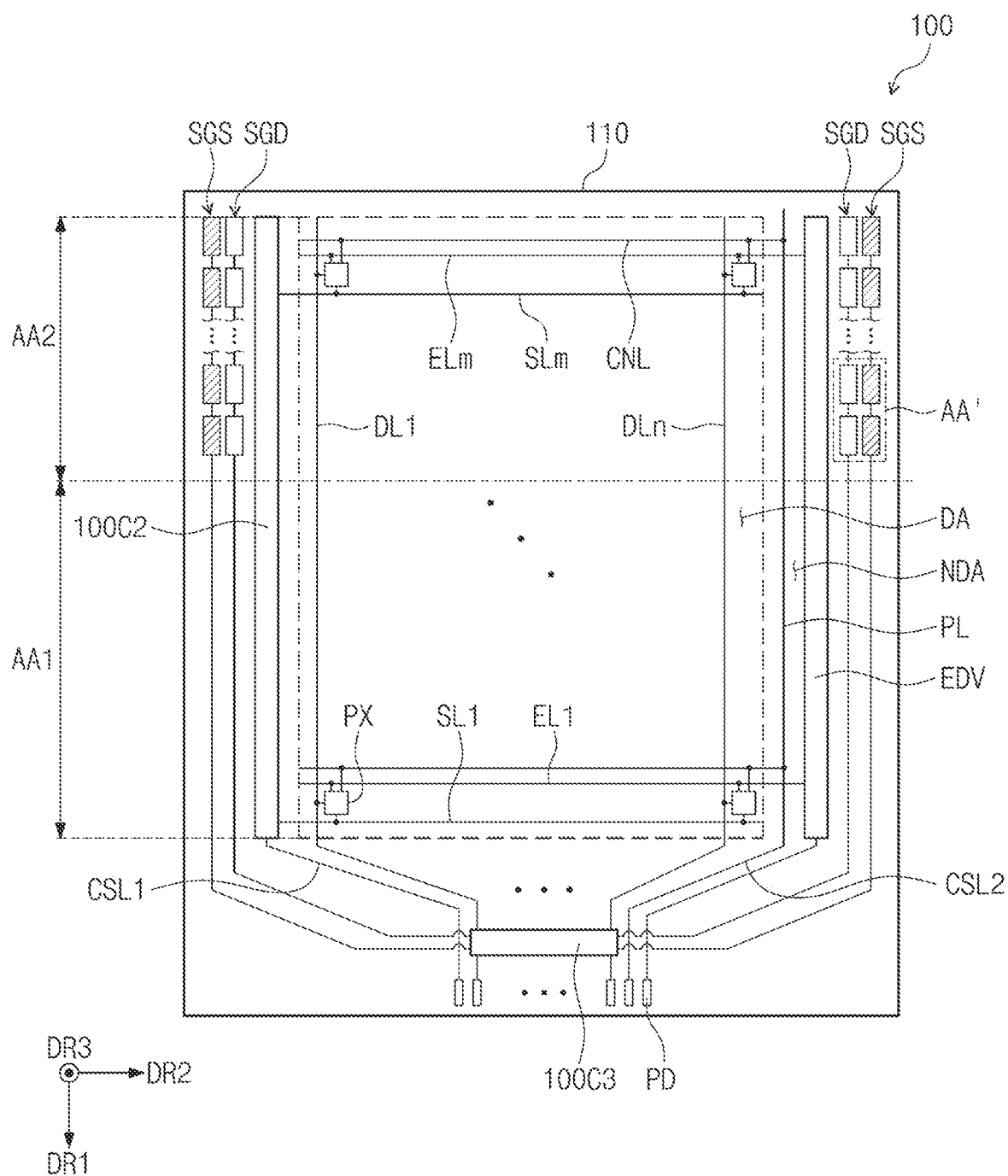
FIG. 9 is a plan view of a display layer according to one or more embodiments of the present disclosure.

FIG. 9 is a plan view of a display layer according to one or more embodiments of the present disclosure.

Referring to FIG. 9, the display layer 100 may include a base layer 110, the plurality of pixels PX, the plurality of signal lines SL1 to SLm, DL1 to DLn, EL1 to ELm, CSL1, CSL2, PL, and CNL electrically connected to the pixels PX, the scan-driving circuit 100C2, the data-driving circuit 100C3, an emission-driving circuit EDV, a plurality of deformation sensors (e.g., deformation-sensing units) SGS, and a plurality of deformation sensor drivers (e.g., deformation-driving units or deformation-sensing-driving units) SGD. The data-driving circuit 100C3 may be referred to as a driving circuit 100C3.

Each of the plurality of pixels may include a pixel-driving circuit composed of a light-emitting element, a plurality of transistors (e.g., switching transistors, driving transistors or the like) connected to the light-emitting element, and at least one capacitor.

The pixels PX may be located in a display area DA. Each of the pixels PX may emit light in correspondence to an electrical signal applied thereto. However, some of the pixels PX may include a thin-film transistor located in a non-display area NDA, and is not limited to any one embodiment.

The scan-driving circuit 100C2, the data-driving circuit 100C3, and the emission-driving circuit EDV may be located in the non-display area NDA. However, the present disclosure is not limited thereto, and at least one among the scan-driving circuit 100C2, the data-driving circuit 100C3, or the emission-driving circuit EDV may be located in the display area DA, thereby reducing the area of the non-display area NDA.

The data-driving circuit 100C3 may be provided in a type of an integrated circuit chip defined as a driving chip to be mounted in the non-display area NDA of the display layer 100. However, the present disclosure is not limited thereto, and the data-driving circuit 100C3 may be mounted on a separate flexible circuit board connected to the display layer 100 to be electrically connected to the display layer 100.

The signal lines SL1 to SLm, DL1 to DLn, EL1 to ELm, CSL1, CSL2, PL, and CNL may include the scan lines DL1 to DLn, the data lines DL1 to DLn, emission lines EL1 to ELm, first and second controls lines CSL1 and CSL2, a power line PL, and connection lines CNL. Here, m and n are natural numbers.

The data lines DL1 to DLn may be insulated from, and may cross, the signal lines SL1 to SLm and the emission lines EL1 to ELm. For example, the scan lines SL1 to SLm may extend in the second direction DR2 to be connected to the scan-driving circuit 100C2. The data lines DL1 to DLn may extend in the first direction DR1 to be connected to the data-driving circuit 100C3. The emission lines EL1 to ELm may extend in the second direction DR2 to be connected to the emission-driving circuit EDV.

The power line PL may extend in the first direction DR1 to be located in the non-display area NDA. In one or more embodiments, the power line PL may be located between the display area DA and the emission-driving circuit EDV. However, the location and arrangement of the power line PL is not limited thereto.

The connection lines CNL may extend in the second direction DR2, and may be arranged in the first direction DR1 to be connected to the power line PL and the pixels PX. The connection lines CNL may be located on different respective layers from the power line PL, and may be electrically connected through a contact hole. However, the present disclosure is not limited thereto, and the connection lines CNL may be integrated with the power line PL on the same layer. The power supply voltage may be applied to the pixels PX through the power line PL and the connection lines CNL that are connected to each other.

The first control line CSL1 may be connected to the scan-driving circuit 100C2. The second control line CSL2 may be connected to the emission-driving circuit EDV.

The pads PD may be located adjacent to the lower end of the non-display area NDA. The pads PD may be more adjacent to the lower end of the display layer 100 than the data-driving circuit 100C3. The pads PD may be spaced apart from each other in the second direction DR2. The pads PD may be portions to which a circuit board is connected, the circuit board being configured to provide a signal for controlling the operations of the scan-driving circuit 100C2, the data-driving circuit 100C3, and the emission-driving circuit EDV of the display layer 100.

The pads PD may be connected to respectively corresponding signal lines among the signal lines. The power line PL and the first and second control lines CSL1 and CSL2 may be connected to the pads PD. The data lines DL1 to DLn may be electrically connected to the corresponding pads PD through the data-driving circuit 100C3.

The scan-driving circuit 100C2 may generate scan signals in response to the scan control signal. The scan signals may be applied to the pixels PX through the scan lines SL1 to SLm. The data-driving circuit 100C3 may generate data voltages corresponding to the image signals in response to the data control signal. The data voltages may be applied to the pixels through the data lines DL1 to DLn. The emission-driving circuit EDV may generate emission signals in response to the emission control signal. The emission signals may be applied to the pixels PX through the emission lines EL1 to ELm.

The pixels PX may receive the data voltages in response to the scan signals. The pixels PX may display an image by emitting light of respective brightness levels corresponding to the data voltages in response to the emission signals. An emission time of the pixels PX may be controlled by the emission signals. Accordingly, the display layer 100 may output an image through the display area DA by the pixels PX.

The plurality of deformation sensors SGS may be adjacent to the display area DA, and may be located in the non-display area NDA. The plurality of deformation sensors SGS may be arranged in the first direction DR1.

The plurality of deformation sensors SGS may be located in the second area AA2. In other words, when viewed in a plan view, the plurality of deformation sensors SGS might not overlap the first area AA1, and may overlap the second area AA2. In a plan view, the plurality of deformation sensors SGS may overlap the plurality of support bars SB (see FIG. 6) and the second support part SP2 (see FIG. 6). In a plan view, the plurality of deformation sensors SGS might not overlap the first support part SP1 (see FIG. 6). The plurality of deformation sensors SGS may be spaced apart from each other with the display area DA interposed therebetween.

Each of the plurality of deformation sensors SGS may have a change in resistance value in correspondence to the shape of the display layer 100. The plurality of deformation sensors SGS may be electrically connected to the data-driving circuit 100C3. Each of the plurality of deformation sensors SGS may be electrically connected in the first direction DR1.

The plurality of deformation sensor drivers SGD may be adjacent to the display area DA, and may be located in the non-display area NDA. The plurality of deformation sensor drivers SGD may be arranged in the first direction DR1. The plurality of deformation sensor drivers SGD may be spaced apart from the plurality of deformation sensors SGS in the second direction DR2.

The plurality of deformation sensor drivers SGD may be located in the second area AA2. When viewed in a plan view, the plurality of deformation sensor drivers SGD may not overlap the first area AA1, and may overlap the second area AA2. When viewed in a plan view, the plurality of deformation sensor drivers SGD may overlap the plurality of support bars SB (see FIG. 6) and the second support part SP2 (see FIG. 6). When viewed in a plan view, the plurality of deformation sensor drivers SGD might not overlap the first support part SP1 (see FIG. 6). The plurality of deformation sensor drivers SGD may be spaced apart from each other with the display area DA interposed therebetween.

The plurality of deformation sensor drivers SGD may be respectively connected to the plurality of deformation sensors SGS. Each of the plurality of deformation sensor drivers SGD may be electrically connected in the first direction DR1. The plurality of deformation sensor drivers SGD may be electrically connected to the data-driving circuit 100C3.

The scan-driving circuit 100C2, the display area DA, the emission-driving circuit EDV, the plurality of deformation sensor drivers SGD, and the plurality of deformation sensors SGS may be sequentially arranged in the second direction DR2. When viewed in a plan view, the plurality of deformation sensors SGS may be located in the outermost region of the display layer 100.

According to one or more embodiments of the present disclosure, the plurality of deformation sensor drivers SGD may sequentially drive the plurality of deformation sensors SGS in the first direction DR1, and on the basis thereof, the data-driving circuit 100C3 may sequentially measure the resistance values of the plurality of deformation sensors SGS. The data-driving circuit 100C3 may understand the sliding position of the display layer 100 on the basis of the resistance values. The display apparatus 1000 (see FIG. 1) may control whether to display an image to be displayed on the second area AA2 on the basis of the sliding position. Therefore, the display apparatus 1000 (see FIG. 1) with improved power efficiency may be provided. Accordingly, the display apparatus 1000 (see FIG. 1) with improved reliability may be provided.

Figure 10A:
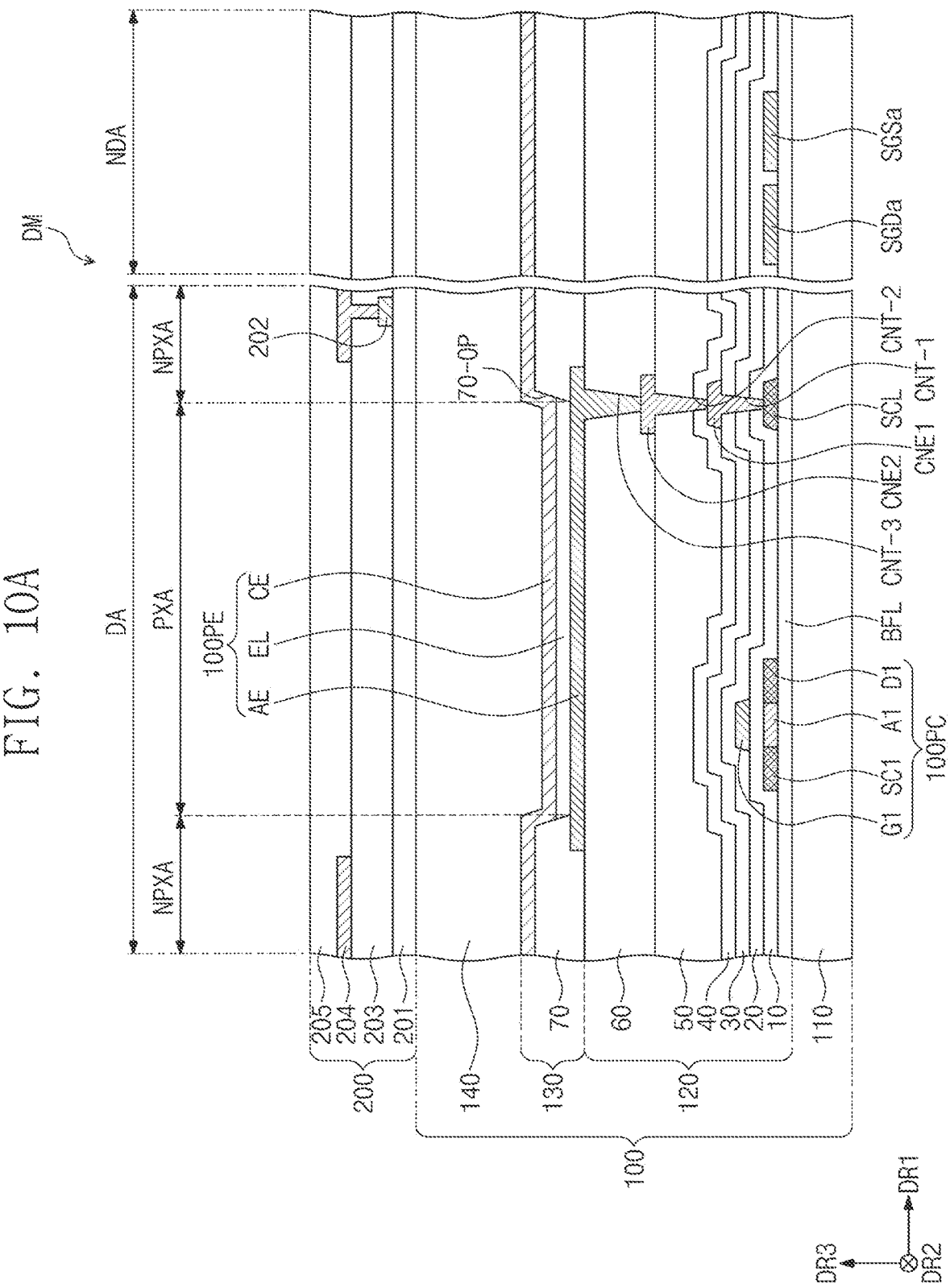
FIGS. 10A and 10B are cross-sectional views of a display layer and a sensor layer according to one or more embodiments of the present disclosure.

FIG. 10A is a cross-sectional view of a display layer and a sensor layer according to one or more embodiments of the present disclosure. In description about FIG. 10A, like reference numerals are given to the elements described with reference to FIG. 5, and a repeated description thereabout will be omitted.

Referring to FIG. 10A, at least one inorganic layer may be provided on the top surface of the base layer 110. The inorganic layer may include at least any one among aluminum oxide, titanium oxide, silicon oxide, silicon oxynitride, zirconium oxide, or hafnium oxide. The inorganic layer may be provided with multilayer. The multilayered inorganic layer may compose a barrier layer and/or a buffer layer. The display layer 100 is illustrated to include the buffer layer BFL.

The buffer layer BFL may enhance the bonding force between the base layer 110 and the semiconductor pattern. The buffer layer BFL may include silicon oxide layers and silicon nitride layers that may be alternately laminated.

The semiconductor pattern may be located on the buffer layer BFL. The semiconductor pattern may include polysilicon. However, the present disclosure is not limited thereto, and the semiconductor pattern may also include amorphous silicon, low-temperature polycrystalline silicon, or oxide semiconductor.

FIG. 10A only illustrates a portion of the semiconductor pattern, and the remaining portion(s) of the semiconductor pattern may be further located in another area. The semiconductor pattern may be arranged in a specific rule across the pixels. The semiconductor pattern has different electrical properties according to whether to be doped or not. The semiconductor pattern may include a first area having high conductivity and a second area having low conductivity. The first area may be doped with an N-type dopant or a P-type dopant. A P-type transistor includes a doped area doped with a P-type dopant, and an N-type transistor includes a doped area doped with an N-type dopant. The second area may be a non-doped area, or may be doped at a low concentration in comparison to the first area.

The first area may have a greater conductivity than the second area, and may substantially operate as an electrode or a signal line. The second area may substantially correspond to an active area (or a channel) of a transistor. In other words, a portion of the semiconductor pattern may be an active area of the transistor, another portion may be a source or a drain, and another portion may be a connection electrode or a signal connection line.

Each of the pixels may have an equivalent circuit including seven transistors, one capacitor, and a light-emitting element, and the equivalent circuit of the pixel may be deformed in various types. In FIG. 10A, one transistor 100PC and a light-emitting element 100PE included in a pixel are illustrated as an example.

The transistor 100PC may include a source SC1, an active area A1, a drain D1, and a gate G1. The source SC1, the active are A1, and the drain D1 may be provided from the semiconductor pattern. The source SC1 and the drain D1 may extend from the active area A1 on a cross section in opposite directions from each other. FIG. 5 illustrates a portion of the signal connection line SCL provided from the semiconductor pattern. In one or more embodiments, the signal connection line SCL may be electrically connected to the drain D1 of the transistor 100PC on a plane. The first insulation layer 10 may be located on the buffer layer BFL. The first insulation layer 10 may commonly overlap the plurality of pixels and may cover the semiconductor pattern. The first insulation layer 10 may be an inorganic layer and/or an organic layer, and may have a single-layer structure or multilayer structure. The first insulation layer 10 may include at least any one among aluminum oxide, titanium oxide, silicon oxide, silicon nitride, silicon oxynitride, zirconium oxide, or hafnium oxide. The first insulation layer 10 may be a silicon oxide layer of a single layer. Not only the first insulation layer 10, but also the insulation layer of the circuit layer 120, which will be described below, may be an inorganic layer and/or an organic layer, and may have a single-layer structure or multilayer structure. The inorganic layer may include at least one among the foregoing materials, but is not limited thereto.

The gate G1 may be located on the first insulation layer 10. The gate G1 may be a portion of a metal pattern. The gate G1 may overlap the active area A1. The gate G1 may function as a mask in a process of doping the semiconductor pattern. The second insulation layer 20 may be located on the first insulation layer 10 and may cover the gate G1. The second insulation layer 20 may commonly overlap the pixels. The second insulation layer 20 may be an inorganic layer and/or an organic layer, and may have a single-layer structure or multilayer structure. The second insulation layer 20 may include any one among silicon oxide, silicon nitride, or silicon oxynitride. The second insulation layer 20 may have a multilayer structure including a silicon oxide layer and a silicon nitride layer.

A third insulation layer 30 may be located on the second insulation layer 20. The third insulation layer 30 may have a single-layer structure or multilayer structure. For example, the third insulation layer 30 may have a multilayer structure including a silicon oxide layer and a silicon nitride layer.

A first connection electrode CNE1 may be located on the third insulation layer 30. The first connection electrode CNE1 may be connected to the signal connection line SCL through a contact hole CNT-1 penetrating through the first to third insulation layers 10, 20, and 30.

A fourth insulation layer 40 may be located on the third insulation layer 30. The fourth insulation layer 40 may be silicon oxide layer of a single layer. A fifth insulation layer 50 may be located on the fourth insulation layer 40. The fifth insulation layer 50 may be an organic layer.

A second connection electrode CNE2 may be located on the fifth insulation layer 50. The second connection electrode CNE2 may be connected to the first connection electrode CNE1 through a contact hole CNT-2 penetrating through the fourth insulation layer 40 and the fifth insulation layer 50.

A sixth insulation layer 60 may be located on the fifth insulation layer 50 and may cover the second connection electrode CNE2. The sixth insulation layer 60 may be an organic layer.

The light-emitting-element layer 130 may be located on the circuit layer 120. The light-emitting-element layer 130 may include a light-emitting element 100PE. For example, the light-emitting-element layer 130 may include an organic light-emitting material, a quantum dot, a quantum rod, a micro-LED, or a nano-LED. Hereinbelow, the light-emitting element 100PE is described as, for example, an organic light-emitting element, but is not limited thereto.

The light-emitting element 100PE may include a first electrode AE, a light-emitting layer EL, and a second electrode CE. The first electrode AE may be located on a sixth insulation layer 60. The first electrode AE is connected to the second connection electrode CNE2 through a contact hole CNT-3 penetrating through the sixth insulation layer 60.

A pixel definition layer 70 may be located on the sixth insulation layer 60 and may cover a portion of the first electrode AE. The pixel definition layer 70 is defined with an opening 70-OP. The opening 70-OP of the pixel definition layer 70 exposes at least a portion of the first electrode AE.

The display area DA may include a light-emitting area PXA, and a non-light-emitting area NPXA adjacent to the light-emitting area PXA. The non-light-emitting area NPXA may surround the light-emitting area PXA. The light-emitting area PXA is defined in correspondence to a partial area of the first electrode AE exposed by the opening 70-OP.

The light-emitting layer EL may be located on the first electrode AE. The light-emitting layer EL may be located on an area corresponding to the opening 70-OP. In other words, the light-emitting layer EL may be separately provided in each of the plurality of pixels. When the light-emitting layer EL are separately provided in each of the pixels, each of the separately provided light-emitting layers EL may emit light of one color among blue, red, and green. However, the present disclosure is not limited thereto, and the light-emitting layers EL may be connected and commonly provided to the pixels. In this case, the light-emitting layer EL may provide blue light, or may provide white light.

The second electrode CE may be located on the light-emitting layer EL. The second electrode CE may have an integrated shape, and may be commonly located in the plurality of pixels.

In one or more other embodiments, a hole control layer may be located between the first electrode AE and the light-emitting layer EL. The hole control layer may be commonly located on the light-emitting area PXA and the non-light-emitting area NPXA. The hole control layer may include a hole transport layer, and may further include a hole injection layer. An electron control layer may be located between the light-emitting layer EL and the second electrode CE. The electron control layer may include an electron transport layer, and may further include an electron injection layer. The hole control layer and the electron control layer may be commonly provided in the plurality of pixels using an open mask.

The encapsulation layer 140 may be located on the light-emitting-element layer 130. The encapsulation layer 140 may include an inorganic layer, an organic layer, and an inorganic layer that are sequentially laminated, but the layers defining the encapsulation layer 140 are not limited thereto.

The inorganic layers may protect the light-emitting-element layer 130 from moisture and oxygen, and the organic layer may protect the light-emitting-element layer 130 from a foreign matter, such as dust particles. The inorganic layers may include a silicon nitride layer, a silicon oxynitride layer, a silicon oxide layer, a titanium oxide layer, or an aluminum oxide layer. The organic layer may include an acrylic-based organic layer, but is not limited thereto.

The sensor layer 200 may be located on the display layer 100 through continuous processes. In this case, the sensor layer 200 may be directly located on the display layer 100, meaning that a third element is not located between the sensor layer 200 and the display layer 100. In other words, a separate adhesive member might not be located between the sensor layer 200 and the display layer 100. Alternatively, the sensor layer 200 may be adhered to the display layer 100 through an adhesive member. The adhesive member may include a typical adhesive or a pressure sensitive adhesive.

The sensor layer 200 may include a base insulation layer 201, a first conductive layer 202, a sensing insulation layer 203, a second conductive layer 204, and a cover insulation layer 205.

The base insulation layer 201 may be an inorganic layer including any one among silicon nitride, silicon oxynitride, and silicon oxide. Alternatively, the base insulation layer 201 may be an organic layer including an epoxy resin, an acrylic resin, or an imide-based resin. The base insulation layer 201 may have a single-layer structure, or a multilayer structure laminated along the third direction DR3.

Each of the first conductive layer 202 and the second conductive layer 204 may have a single-layer structure or a multilayer structure laminated along the third direction DR3. The first conductive layer 202 and the second conductive layer 204 may provide a sensing electrode configured to sense an external input.

The conductive layer of the single layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO) or the like. In addition, the transparent conductive layer may include a conductive polymer, such as PEDOT, a metal nanowire, or graphene.

The conductive layer of a multilayer structure may include metal layers. For example, the layers may have a three-layer structure of titanium/aluminum/titanium. The conductive layer of the multilayer structure may include at least one metal layer and at least one transparent conductive layer.

At least one of the sensing insulation layer 203 and the cover insulation layer 205 may include an inorganic film. The inorganic film may include at least any one among aluminum oxide, titanium oxide, silicon oxide, silicon oxynitride, zirconium oxide or hafnium oxide.

At least one of the sensing insulation layer 203 and the cover insulation layer 205 may include an organic film. The organic film may include at least one among an acrylic-based resin, a meta-acrylic-based resin, polyisoprene, a vinyl-based resin, an epoxy-based resin, a urethane-based resin, a cellulose-based resin, a siloxane-based resin, a polyimide based-resin, a polyamide-resin, and a parylene-based resin.

The deformation sensor SGSa and the deformation sensor driver SGDa may be located on the buffer layer BFL. The deformation sensor SGSa and the deformation sensor driver SGDa may be provided on the same layer as the transistor 100PC. For example, the deformation sensor SGSa and the deformation sensor driver SGDa may be located on the same layer as the source SC1, the active area A1, and the drain D1. However, this is an example, the arrangement relationship between the deformation sensors SGSa and the deformation sensor driver SGDa according to one or more embodiments of the present disclosure is not limited thereto. For example, the deformation sensor SGSa and the deformation sensor driver SGDa may be located on the same layer as the gate G1.

According to one or more embodiments of the present disclosure, the deformation sensor SGSa and the deformation sensor driver SGDa may be provided in the same layer as the display layer 100. The deformation sensor drivers SGDa may sequentially drive the deformation sensor SGSa in the first direction DR1, and on the basis thereof, the data-driving circuit 100C3 may sequentially measure the resistance values of the plurality of deformation sensors SGSa. The data-driving circuit 100C3 may determine the sliding position of the display layer 100 on the basis of the resistance values. In the display apparatus 1000 (see FIG. 1), a configuration for determining the sliding position may be located in the non-display area NDA, and a separate configuration may not be required. In the case CS (see FIG. 6), a mounting space for the separate configuration may not be required.

Figure 10B:
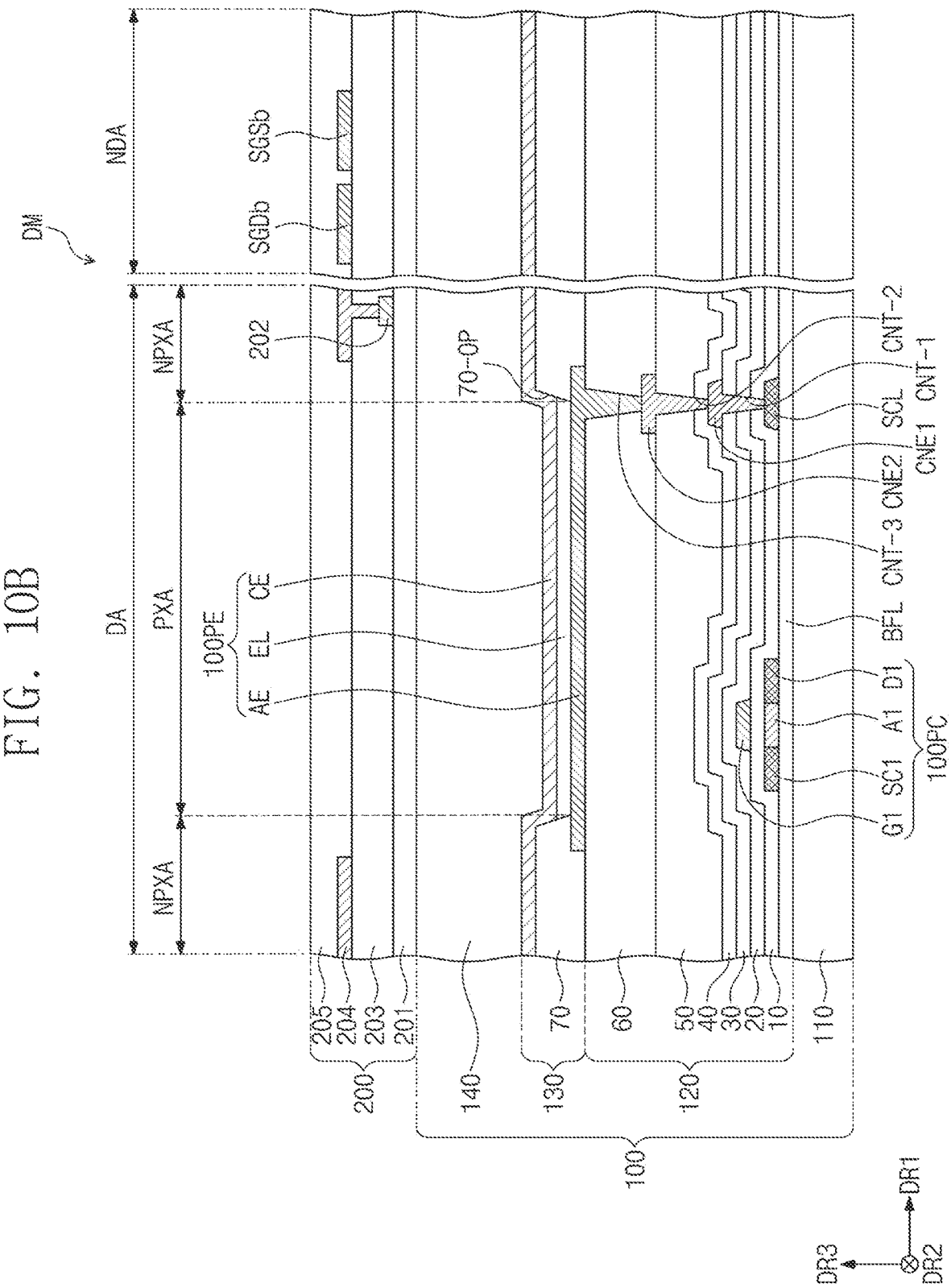

FIG. 10B is a cross-sectional view of a display layer and a sensor layer according to one or more embodiments of the present disclosure. When describing FIG. 10B, like reference numerals are given to the elements described with reference to FIG. 10A, and repeated descriptions about the element will be omitted.

Referring to FIG. 10B, a deformation sensor SGSb and a deformation sensor driver SGDb may be located on the base insulation layer 201. The deformation sensor SGSb and the deformation sensor driver SGDb may be provided on the same layer as the sensing electrode of the sensor layer 200. For example, the deformation sensor SGSb and the deformation sensor driver SGDb may be located in the same layer as the second conductive layer 204. However, this is an example, the disposition relationship between the deformation sensors SGSb and the deformation sensor driver SGDb according to one or more embodiments of the present disclosure is not limited thereto. For example, the deformation sensor SGSb and the deformation sensor driver SGDb may be located in the same layer as the first conductive layer 202.

According to one or more embodiments of the present disclosure, the deformation sensor SGSb and the deformation sensor driver SGDb may be provided in the sensor layer 200. The deformation sensor drivers SGDb may sequentially drive the deformation sensor SGSb in the first direction DR1, and on the basis thereof, the data-driving circuit 100C3 may sequentially measure the resistance values of the plurality of deformation sensors SGSb. The data-driving circuit 100C3 may understand the sliding position of the display layer 100 on the basis of the resistance values. In the display apparatus 1000 (see FIG. 1), a configuration for determining the sliding position may be located in the non-display area NDA, and a separate configuration may not be required. In the case CS (see FIG. 6), a mounting space for the separate configuration may not be required.

Figure 11:
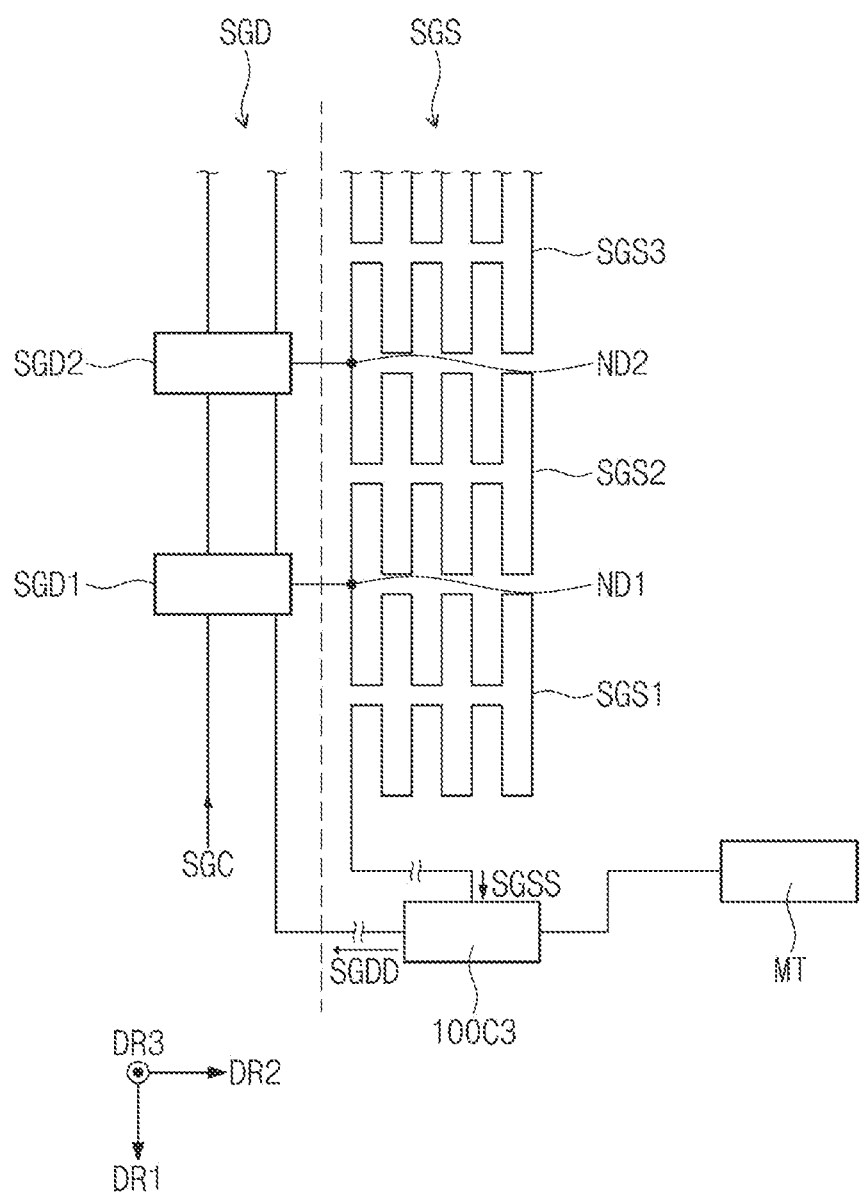
FIG. 11 is a plan view of a data-driving circuit, a motor, and an AA' area shown in FIG. 9, according to one or more embodiments of the present disclosure.
Figure 12:
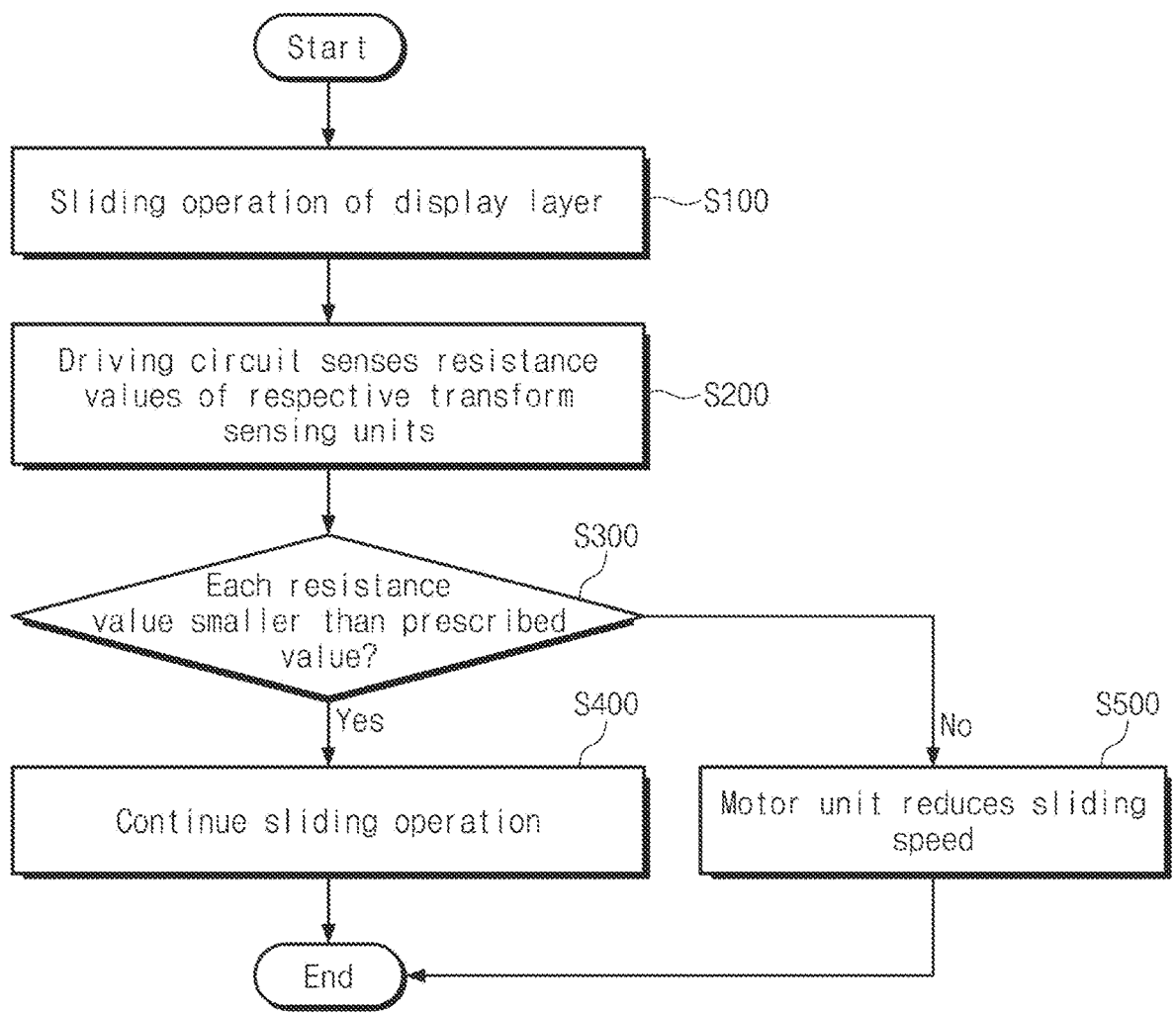
FIG. 12 is a flowchart illustrating driving of a display apparatus according to one or more embodiments of the present disclosure.

FIG. 11 is a plan view of the data-driving circuit, the motor (e.g., motor unit), and the AA' area of FIG. 9 according to one or more embodiments of the present disclosure, and FIG. 12 is a flowchart showing driving of a display apparatus according to one or more embodiments of the present disclosure. When describing FIG. 11, like reference numerals are given to the elements described with reference to FIG. 9, and repeated description about the elements will be omitted.

Referring to FIGS. 9, 11, and 12, each of the plurality of deformation sensors SGS may include a strain gauge that generates a resistance value indicating the strain applied by the transform of the display layer 100. The strain gauge may have a spirally wound shape.

The plurality of deformation sensors SGS may include a first deformation sensor SGS1, a second deformation sensor SGS2, and a third deformation sensor SGS3. The first deformation sensor SGS1, the second deformation sensor SGS2, and the third deformation sensor SGS3 may be arranged in the opposite direction to the first direction DR1, and may be electrically connected to each other. FIG. 11 illustrates an example of three deformation sensors SGS, but the number of the plurality of deformation sensors SGS according to one or more embodiments of the present disclosure is not limited thereto.

One end of the first deformation sensor SGS1 may be connected to a first node ND1, and the other end may be electrically connected to the data-driving circuit 100C3. One end of the second deformation sensor SGS2 may be connected to a second node ND2, and the other end may be connected to the first node ND1. One end of the third deformation sensor SGS3 may be connected to a third node in one or more embodiments, and the other end of the third deformation sensor SGS3 may be connected to the second node ND2.

The plurality of deformation sensor drivers SGD may include a first deformation sensor driver SGD1 and a second deformation sensor driver SGD2. The first deformation sensor driver SGD1 and the second deformation sensor driver SGD2 may be arranged in the opposite direction to the first direction DR1, and may be electrically connected to each other. FIG. 11 illustrates an example of two deformation sensor drivers SGD, but the number of the plurality of deformation sensor drivers SGD according to one or more embodiments of the present disclosure is not limited thereto.

The plurality of deformation sensor drivers SGD may be provided with a driving signal SGC. The driving signal SGC may sequentially drive the plurality of deformation sensor drivers SGD in the opposite direction to the first direction DR1.

The plurality of deformation sensor drivers SGD may be provided with a voltage SGDD. When one of the plurality of deformation sensor drivers SGD is driven by the driving signal SGC, the data-driving circuit 100C3 may provide the first voltage SGDD to the deformation sensor SGS connected to one of the plurality of deformation sensor drivers SGD. The data-driving circuit 100C3 may receive a second voltage SGSS from the plurality of deformation sensors SGS. The data-driving circuit 100C3 may sequentially measure the respective resistance values of the plurality of deformation sensors SGS on the basis of the second voltage SGSS.

The data-driving circuit 100C3 may determine the boundary between the first part AAP1 (see FIG. 7) and the second part AAP2 (see FIG. 7) on the basis of the resistance values. The data-driving circuit 100C3 may determine the sliding position of the display layer 100 on the basis of the boundary.

According to one or more embodiments of the present disclosure, the data-driving circuit 100C3 may determine the position of a deformed portion by means of the plurality of deformation sensors SGS. The data-driving circuit 100C3 may determine the sliding position of the display layer 100 on the basis of the resistance values. In consideration of the sliding position, the display layer 100 may display an image in the second area AA2 exposed to the outside, and might not display an image in the second area AA2 that is not exposed to the outside. Accordingly, the display apparatus 1000 (see FIG. 1) with reduced power consumption may be provided.

For example, when the first deformation sensor driver SGD1 is driven by the driving signal SGC, the first voltage SGDD may be provided through the first node ND1. The data-driving circuit 100C3 may receive the second voltage SGSS from the first deformation sensor SGS1. The data-driving circuit 100C3 may measure a first resistance value of the first deformation sensor SGS1 on the basis of the second voltage SGSS. The data-driving circuit 100C3 may determine the sliding position of the display layer 100 on the basis of the first resistance value. When the first deformation sensor SGS1 is slid to be located in the curvature area CA (see FIG. 6), the first deformation sensor SGS1 may be deformed. The data-driving circuit 100C3 may determine, on the basis of a change in the first resistance value, whether the first deformation sensor SGS1 is deformed. The data-driving circuit 100C3 may determine the boundary between the first part AAP1 (see FIG. 7) and the second part AAP2 (see FIG. 7) on the basis of the change in the first resistance value, and may determine the sliding position of the display layer 100.

Alternatively, the first resistance value of the first deformation sensor SGS1 is measured, and then the second deformation sensor driver SGD2 may be driven by the driving signal SGC. The first voltage SGDD may be provided through the second node ND2. The data-driving circuit 100C3 may receive the second voltage SGSS from the second deformation sensor SGS2 and the first deformation sensor SGS1. The data-driving circuit 100C3 may measure a second resistance value of the second deformation sensor SGS2 on the basis of the second voltage SGSS. The data-driving circuit 100C3 may determine the sliding position of the display layer 100 on the basis of the second resistance value. When the second deformation sensor SGS2 is slid to be located in the curvature area CA (see FIG. 6), the second deformation sensor SGS2 may be deformed. The data-driving circuit 100C3 may determine, on the basis of a change in the second resistance value, whether the second deformation sensor SGS2 is deformed. The data-driving circuit 100C3 may determine the boundary between the first part AAP1 (see FIG. 7) and the second part AAP2 (see FIG. 7) on the basis of the change in the second resistance value, and may determine the sliding position of the display layer 100.

According to one or more embodiments of the present disclosure, the plurality of deformation sensor drivers SGD may sequentially drive the plurality of deformation sensors SGS in the first direction DR1, and on the basis thereof, the data-driving circuit 100C3 may sequentially measure the resistance values of the plurality of deformation sensors SGS. The data-driving circuit 100C3 may understand or determine the sliding position of the display layer 100 on the basis of the resistance values. The display apparatus 1000 (see FIG. 1) may control whether to display an image to be displayed on the second area AA2 on the basis of the determined sliding position. For example, the image may be displayed on the first portion AAP1 (see FIG. 7), and the image might not be displayed on the second portion AAP2 (see FIG. 7). Therefore, the display apparatus 1000 (see FIG. 1) with improved power efficiency may be provided.

Accordingly, the display apparatus 1000 (see FIG. 1) with improved reliability may be provided.

The display apparatus 1000 (see FIG. 1) may further include a motor MT. The motor MT may control the rotation unit RU (see FIG. 6). The motor MT may drive the display layer 100 to the closed state or open state.

Referring to FIG. 12, the display layer 100 may be slid (operation S100). The data-driving circuit 100C3 may sense resistance values of the plurality of deformation sensors SGS respectively (operation S200). The motor MT may be controlled on the basis of the resistance values measured for the plurality of deformation sensors SGS. The data-driving circuit 100C3 may compare each of the resistance values with a prescribed value set in advance (operation S300).

When the resistance value is less than the prescribed value, the motor MT may continue the sliding operation of the display layer 100 (operation S400).

When the resistance value is greater than the prescribed value, the motor MT may reduce a sliding speed of the display layer 100 (operation S500).

Unlike previously described embodiments, when the sliding speed of the display layer 100 is not controlled and exceeds a prescribed speed, a driving force for sliding the display layer 100 may be reduced. In addition, a stress, applied at the time when the display layer 100 is slid, increases to cause the display apparatus 1000 (see FIG. 1) to be damaged. However, according to one or more embodiments of the present disclosure, the motor MT may control the sliding speed of the display layer 100 not to exceed the prescribed speed. The motor MT may secure the driving force for sliding the display layer 100, and may reduce or prevent the likelihood of damage being applied to the display apparatus 1000 (see FIG. 1) by a transient load generated at the time of sliding. Accordingly, the display apparatus 1000 (see FIG. 1) with improved reliability may be provided.

Figure 13:
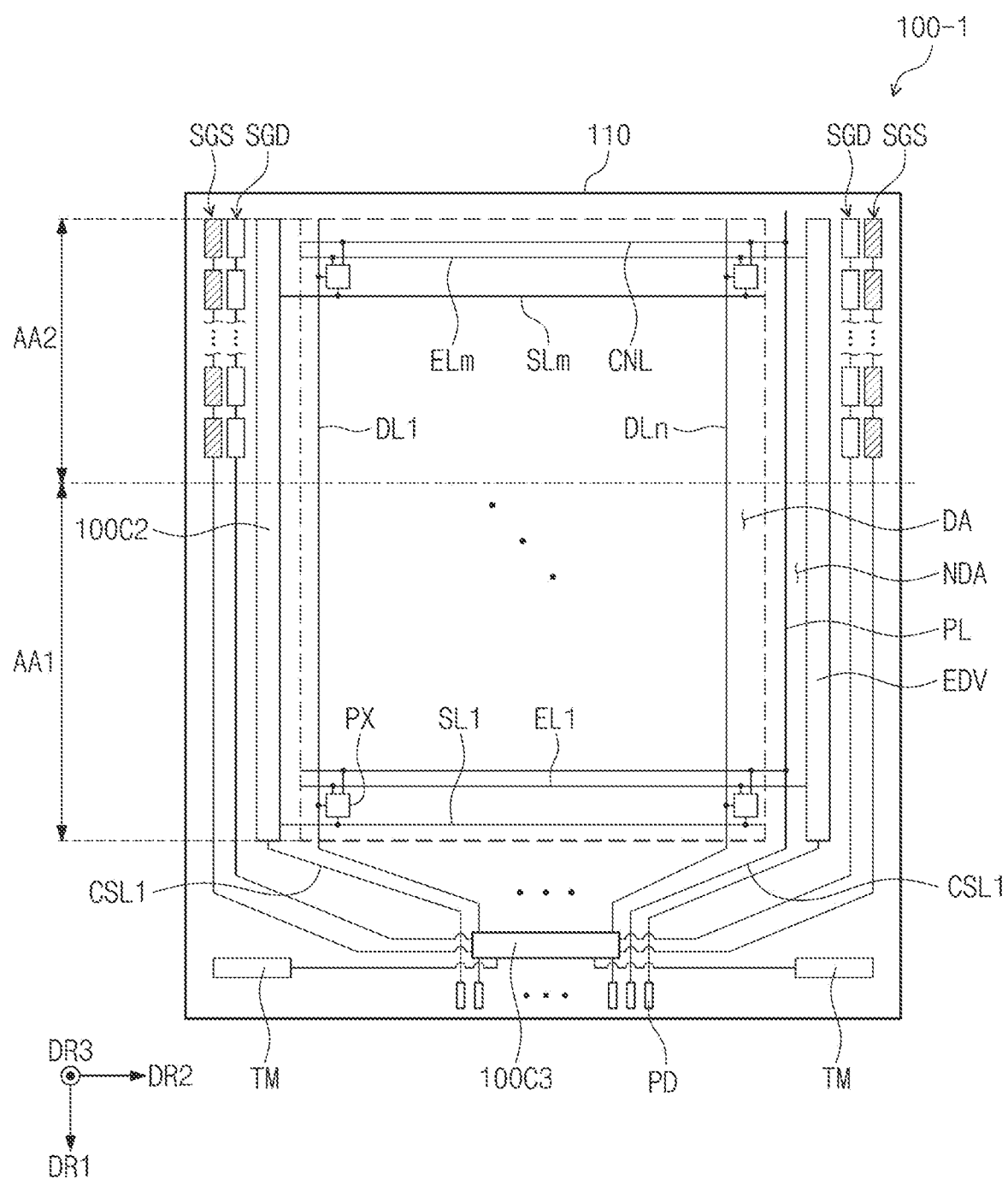
FIG. 13 is a plan view of a display layer according to one or more embodiments of the present disclosure.

FIG. 13 is a plan view of a display layer according to one or more embodiments of the present disclosure. When describing FIG. 13, like reference numerals are given to the elements described with reference to FIG. 9, and repeated descriptions about the elements will be omitted.

Referring to FIGS. 11 and 13, the display apparatus 1000 (see FIG. 1) may further include a thermometer (e.g., a temperature measurement unit) TM. The thermometer TM may be located in the non-display area NDA of a display layer 100-1. The thermometer TM may be electrically connected to the data-driving circuit 100C3.

The thermometer TM may measure temperature information about the display layer 100-1. For example, the thermometer TM may include a strain gauge. The thermometer TM may provide a resistance change due to the temperature to the data-driving circuit 100C3. The data-driving circuit 100C3 may respectively measure the resistance values of the plurality of deformation sensors SGS in consideration of the temperature information measured by the thermometer TM. The data-driving circuit 100C3 may drive the motor MT on the basis of the temperature information.

As the temperature is lower, the driving force suitable for the motor MT to slide the display layer 100 may increase. According to one or more embodiments of the present disclosure, the thermometer TM may measure the temperature information about the display layer 100-1. The data-driving circuit 100C3 may control the motor MT on the basis of the measured temperature information. The motor MT may control the driving force suitable for the sliding operation of the display layer 100-1 in consideration of the temperature information. Accordingly, the display apparatus 1000 (see FIG. 1) with improved reliability may be provided.

Figure 14:
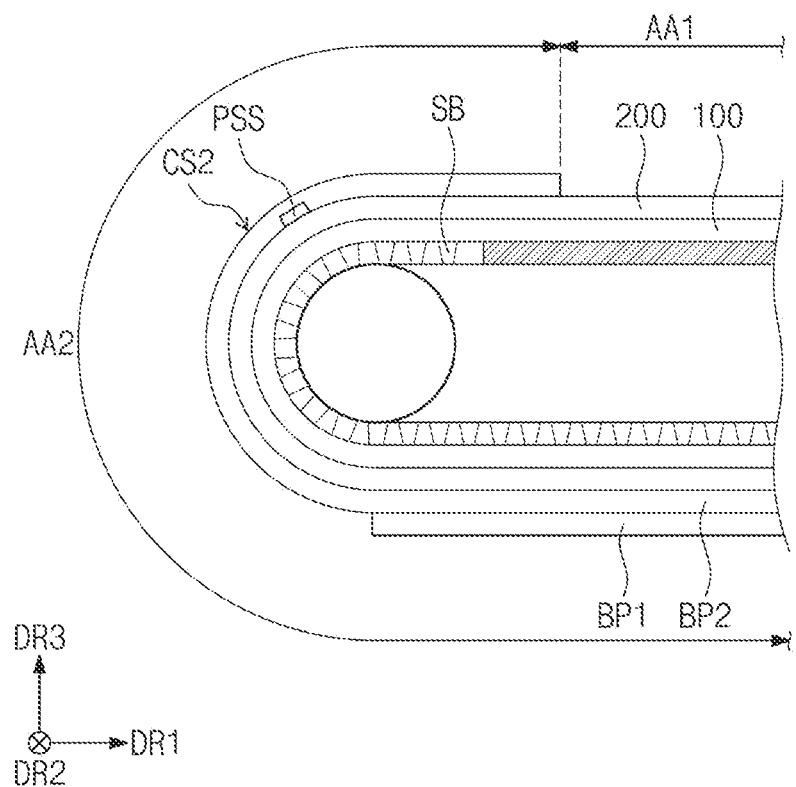
FIG. 14 is a cross-sectional view of a portion of a display apparatus according to one or more embodiments of the present disclosure.
Figure 15:
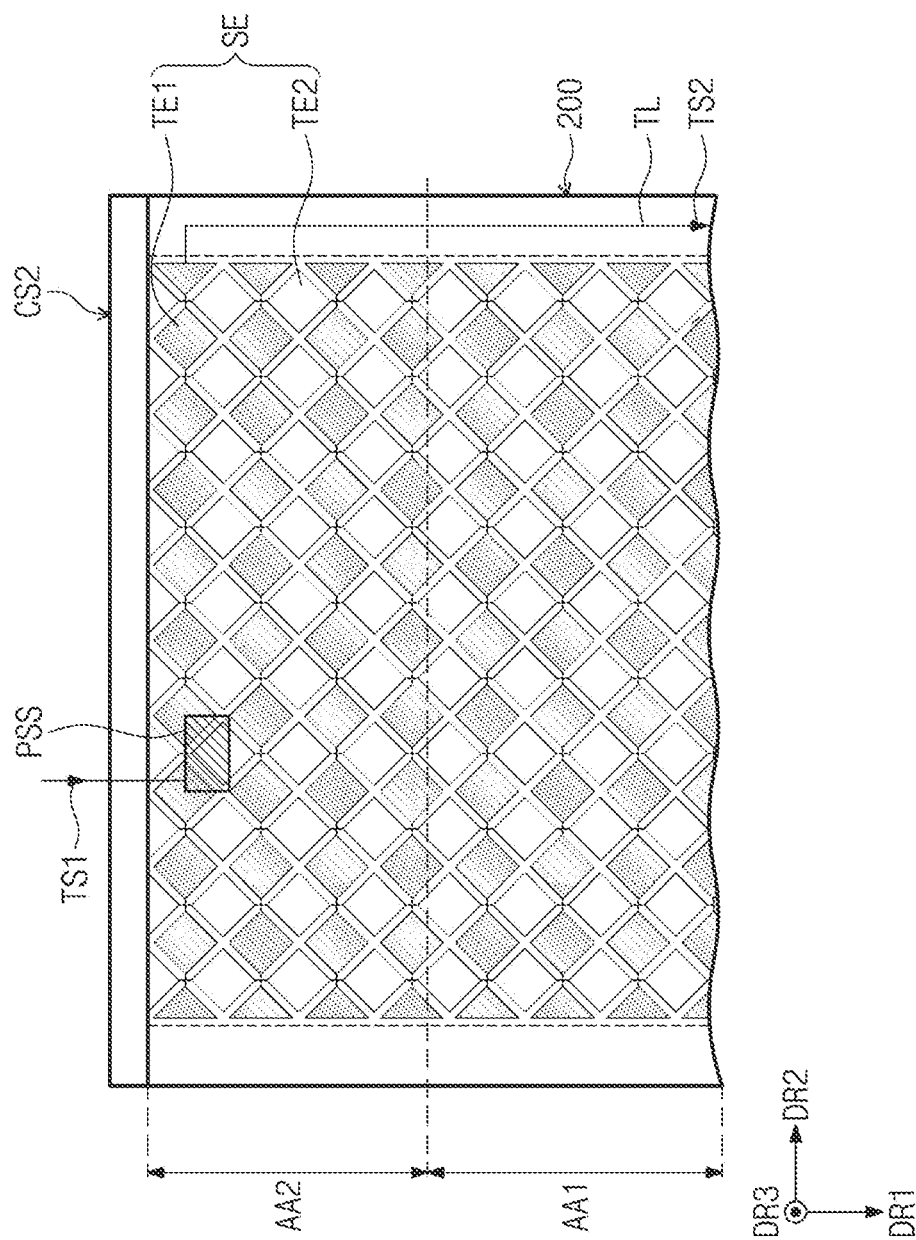
FIG. 15 illustrates a sensor layer and a position-sensing sensor according to one or more embodiments of the present disclosure.

FIG. 14 is a cross-sectional view of a portion of a display apparatus according to one or more embodiments of the present disclosure, and FIG. 15 illustrates a sensor layer and a position-sensing sensor according to one or more embodiments of the present disclosure. When describing FIG. 14, like reference numerals are given to the elements described in relation to FIG. 6, and repeated descriptions about the elements will be omitted.

Referring to FIGS. 14 and 15, the sensor layer 200 may include an active area and a non-active area adjacent to the active area. The active area may be an area activated according to an electrical signal. The active area may be an area through which an input is sensed. When viewed in a plan view, the active area may overlap the display area DA (see FIG. 9) of the display layer 100. The non-active area may overlap the non-display area NDA (see FIG. 9) of the display layer 100.

The sensor layer 200 may include the plurality of sensing electrodes SE and the plurality of sensing lines TL. The plurality of sensing electrodes SE may be located in the active area. The plurality of sensing lines TL may be located in the non-active area.

The plurality of sensing electrodes SE may include a plurality of first sensing electrodes TE1 and a plurality of second sensing electrodes TE2. The sensor layer 200 may acquire information about an external input through a change in electrostatic capacity between the plurality of first sensing electrodes TE1 and the plurality of second sensing electrodes TE2.

Each of the plurality of first sensing electrodes TE1 may extend along the first direction DR1 and may be arranged along the second direction DR2.

Each of the plurality of second sensing electrodes TE2 may extend along the second direction DR2 and may be arranged along the first direction DR1.

The plurality of sensing lines TL may be electrically connected to the plurality of sensing electrodes SE respectively.

The second case CS2 may include a position-sensing sensor PSS. The position-sensing sensor PSS may include a conductive material. For example, a material of the position-sensing sensor PSS may not be limited as long as the material provides capacitance together with the plurality of sensing electrodes SE. The position-sensing sensor PSS may be provided with a first signal TS1.

The first signal TS1 may be different from a second signal provided to the plurality of first sensing electrodes TE1 or the plurality of second sensing electrodes TE2 so that the plurality of sensing electrodes SE sense an external input. For example, the first signal TS1 may have a frequency of about 400 kHz, and the second signal have a frequency of about 200 kHz.

As the display layer 100 is slid and changed from the open state to the closed state, the plurality of sensing electrodes SE and the position-sensing sensor PSS may overlap when viewed in a plan view. The position-sensing sensor PSS provided with the first signal TS1 may provide the capacitance together with the plurality of sensing electrodes SE. A sensing signal TS2 may be received by the capacitance through the plurality of sensing lines TL.

The touch-driving circuit may sense the sensing electrodes SE overlapping the position sensor PSS on the basis of the sensing signal TS2. The touch-driving circuit may determine the sliding positions of the display layer 100 and the sensor layer 200 on the basis of the sensed sensing electrode SE. However, this is an example, and the configuration configured to determine the sliding position according to one or more embodiments of the present disclosure is not limited thereto. For example, the sliding position may be output from the data-driving circuit 100C3. In other words, the sliding position of the display layer 100 may be determined on the basis of the position-sensing sensor PSS and the plurality of sensing electrodes SE.

According to one or more embodiments of the present disclosure, the display apparatus 1000 (see FIG. 1) may understand the sliding position of the display layer 100 using the position-sensing sensor PSS and the plurality of sensing electrodes SE. The display apparatus 1000 (see FIG. 1) may control whether to display an image to be displayed on the second area AA2 on the basis of the sliding position. Therefore, the display apparatus 1000 (see FIG. 1) with improved power efficiency may be provided. Accordingly, the display apparatus 1000 (see FIG. 1) with improved reliability may be provided.

According to the above-described, the plurality of deformation sensor drivers may sequentially drive the plurality of deformation sensors along the first direction. On the basis thereof, the driving circuit may sequentially measure the resistance values of the plurality of deformation sensors. The driving circuit may understand the sliding position of the display layer on the basis of the resistance values. The display apparatus may control whether to display an image to be displayed in a second area on the basis of the sliding position. Accordingly, the display apparatus with improved power efficiency may be provided. Therefore, the display apparatus with improved reliability may be provided.

While this the present disclosure has been described with reference to embodiments thereof, it will be clear to those of ordinary skill in the art to which the present disclosure pertains that various changes and modifications may be made to the described embodiments without departing from the spirit and technical area of the present disclosure as defined in the appended claims and their equivalents. Thus, the scope of the present disclosure shall not be restricted or limited by the foregoing description, but be determined by the broadest permissible interpretation of the following claims, with functional equivalents thereof to be included therein.

What is claimed is:

1. A display apparatus comprising:
    a display layer comprising scan lines, data lines, and pixels, and defined by:
        a first area exposed to an outside in both a closed state and an open state; and
        a second area, which extends from the first area in a first direction, is exposed to an outside in the open state, and in which at least a portion thereof is opposite to the first area in the closed state;
    a scan-driving circuit connected to the scan lines;
    deformation sensors arranged in the first direction, in a non-display area surrounding a display area of the display layer in a plan view, and having resistance values corresponding to respective shapes of the display layer;
    deformation sensor drivers arranged in the first direction, respectively connected to the deformation sensors, and configured to drive the deformation sensors along the first direction; and
    a driving circuit configured to measure the resistance values of the deformation sensors
    wherein the display area of the display layer, the scan-driving circuit, and the deformation sensors are sequentially arranged in a second direction crossing the first direction.

2. The display apparatus of claim 1, wherein each of the deformation sensors comprises a strain gauge having a spirally wound shape.

3. The display apparatus of claim 1, wherein the deformation sensors are in the second area.

4. The display apparatus of claim 1, further comprising a motor configured to drive the display layer to the closed state or to the open state, and configured to be controlled based on the resistance values measured from the deformation sensors.

5. The display apparatus of claim 4, further comprising a thermometer electrically connected to the driving circuit, and configured to measure temperature information about the display layer,
    wherein the driving circuit is configured to drive the motor based on the temperature information.

6. The display apparatus of claim 4, wherein, when each of the resistance values is greater than a prescribed value, the motor is configured to reduce a sliding speed of the display layer.

7. The display apparatus of claim 1, further comprising:
    a sensor layer on the display layer, and comprising sensing electrodes; and
    a case comprising a position-sensing sensor, configured to accommodate the display layer, and configured to switch between the closed state and the open state through a sliding operation,
    wherein a sliding position of the display layer is configured to be determined based on the position-sensing sensor and the sensing electrodes.

8. The display apparatus of claim 7, wherein the sensing electrodes and the position-sensing sensor overlap each other in the closed state.

9. The display apparatus of claim 7, wherein the deformation sensors and the deformation sensor drivers are on a same layer as the sensing electrodes.

10. The display apparatus of claim 1, wherein a first portion exposed to the outside, and a second portion extending from the first portion and not exposed to the outside, are defined in the second area, and
    wherein the driving circuit is configured to determine a boundary between the first portion and the second portion based on the resistance values, and is configured to determine a sliding position of the display layer based on the boundary.

11. The display apparatus of claim 10, wherein the driving circuit is configured to display an image on the first portion and not on the second portion.

12. The display apparatus of claim 1, wherein the pixels comprise transistors and light-emitting elements, and
    wherein the deformation sensors and the deformation sensor drivers are on a same layer as at least one of the transistors.

13. A display apparatus comprising:
    a display layer comprising scan lines, and defined by a first area and a second area arranged along a first direction;
    a scan-driving circuit connected to the scan lines;
    deformation sensors arranged in the first direction, in a non-display area surrounding a display area of the display layer in a plan view, and having respective resistance values corresponding to respective shapes of the display layer; and a driving circuit configured to measure the resistance values of the deformation sensors along the first direction, wherein the display area of the display layer, the scan-driving circuit, and the deformation sensors are sequentially arranged in a second direction crossing the first direction.

14. The display apparatus of claim 13, further comprising deformation sensor drivers arranged along the first direction, respectively connected with the deformation sensors, and configured to drive the deformation sensors along the first direction.

15. The display apparatus of claim 13, further comprising a motor configured to drive a sliding state of the second area, and configured to be controlled based on the respective resistance values measured from the deformation sensors.

16. The display apparatus of claim 13, further comprising:
a sensor layer on the display layer, and comprising sensing electrodes; and
a case configured to accommodate the second area through a sliding operation of the display layer, and comprising a position-sensing sensor,
wherein a sliding position of the display layer is configured to be determined based on the position-sensing sensor and the sensing electrodes.

17. The display apparatus of claim 13, wherein the driving circuit is configured to determine a boundary between a first portion and a second portion based on the resistance values, is configured to determine a sliding position of the display layer based on the boundary, and is configured to display an image on the first portion and not on the second portion.

* * * * *